US007049850B2

(12) United States Patent
Shimizu

(10) Patent No.: US 7,049,850 B2
(45) Date of Patent: May 23, 2006

(54) SEMICONDUCTOR DEVICE WITH A VOLTAGE DETECTING DEVICE TO PREVENT SHOOT-THROUGH PHENOMENON IN FIRST AND SECOND COMPLEMENTARY SWITCHING DEVICES

(75) Inventor: Kazuhiro Shimizu, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 143 days.

(21) Appl. No.: 10/780,735

(22) Filed: Feb. 19, 2004

(65) Prior Publication Data

US 2004/0212021 A1    Oct. 28, 2004

(30) Foreign Application Priority Data

Apr. 24, 2003    (JP)   ............... 2003-119641

(51) Int. Cl.
    *H03K 19/91*      (2006.01)

(52) U.S. Cl. ........................... 326/100; 326/80; 326/81

(58) Field of Classification Search ................ 326/100, 326/80, 81, 68, 72

See application file for complete search history.

(56) References Cited

U.S. PATENT DOCUMENTS

| 4,292,642 | A | | 9/1981 | Appels et al. | |
|---|---|---|---|---|---|
| 5,304,870 | A | * | 4/1994 | Nagasawa | ..................... 326/68 |
| 5,455,439 | A | | 10/1995 | Terashima et al. | |
| 5,506,535 | A | * | 4/1996 | Ratner | ......................... 326/80 |
| 5,907,182 | A | | 5/1999 | Terashima | |
| 6,373,285 | B1 | * | 4/2002 | Konishi | ....................... 326/81 |
| 6,774,674 | B1 | * | 8/2004 | Okamoto et al. | ............. 326/80 |

FOREIGN PATENT DOCUMENTS

JP            9-172358        6/1997

* cited by examiner

*Primary Examiner*—Don Le
*Assistant Examiner*—Lam T. Mai
(74) *Attorney, Agent, or Firm*—Oblon, Spivak, McClelland, Maier & Neustadt, P.C.

(57) ABSTRACT

An HNMOS transistor (4) has its drain electrode connected to the gate electrode of an NMOS transistor (21), and a logic circuit voltage (VCC) is applied to the drain electrode of the NMOS transistor (21) through a resistor (32). A ground potential is applied to the source electrode of the NMOS transistor (21). A drain potential (V2) at the NMOS transistor (21) is monitored by an interface circuit (1), for indirectly monitoring a potential (VS). Thus provided is a high voltage integrated circuit for preventing damage to a semiconductor device used for performing bridge rectification of a power line.

26 Claims, 29 Drawing Sheets

FIG. 9

| INPUT | | | OUTPUT |
|---|---|---|---|
| A | B | C | Y |
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

SEMICONDUCTOR DEVICE WITH A VOLTAGE DETECTING DEVICE TO PREVENT SHOOT-THROUGH PHENOMENON IN FIRST AND SECOND COMPLEMENTARY SWITCHING DEVICES

BACKGROUND OF THE INVENTION

1. Field of the Invention

The present invention relates to a semiconductor device, and more particularly, to a high voltage integrated circuit.

2. Description of the Background Art

A high voltage integrated circuit (HVIC) is a device indispensable for achieving great functionality and cost reduction in the field of mechatronics including motor control.

For instance, an HVIC is employed as a gate driver in a power transistor such as an IGBT (Integrated Gate Bipolar Transistor) used for performing bridge rectification of a power line. In this HVIC, when a high side IGBT and a low side IGBT are brought into an on state at the same time (which is called a "shoot-through" phenomenon), short-circuit occurs between arms (power lines) to cause a large current to flow into the IGBTs, which are therefore damaged.

To prevent this, the HVIC is controlled such that a high side gate driver output and a low side gate driver output are complementarily outputted. However, since the gate driver outputs are not monitored in practice, the high side IGBT is short-circuited in the case where a potential at a node between the high side IGBT and low side IGBT (hereinafter referred to as "potential VS") is short-circuited to a ground potential (GND) (i.e., ground-fault occurs) due to failure in loads or the like while the high side gate driver continues outputting (i.e., while the high side IGBT is in an ON state). Therefore, the high side IGBT needs to be turned off immediately, however, the HVIC is incapable of determining that the potential VS has become GND, and therefore causes the high side gate driver to continue outputting.

To prevent this, simply saying, the potential VS may be monitored. However, the potential VS usually reaches several hundred volts. Thus, it is impossible to monitor the potential VS within the HVIC.

For instance, Japanese Patent Application Laid-Open No. 9-172358 (1997) discloses detecting overcurrent in the case where an emitter terminal of a high side IGBT is short-circuited to GND, thereby controlling the high side IGBT on the basis of a detection signal (see columns 6–7, FIGS. 1–3). With this method, however, a certain period of time is required until a control signal is applied to the high side IGBT, during which short-circuit continues. Therefore, the high side IGBT needs to have resistance to a short-circuit state for a certain period of time, which is a contributing factor responsible for increase in manufacturing costs.

SUMMARY OF THE INVENTION

An object of the present invention is to provide a high voltage integrated circuit for preventing damage to a semiconductor device used for performing bridge rectification of a power line.

A first aspect of the present invention is directed to a semiconductor device including a high potential part, a low side logic circuit, first and second level shift parts and a voltage detecting device, and performs drive control of first and second switching devices connected in series and interposed between a high main power potential and a low main power potential. The high potential part includes a control part configured to control conduction/non-conduction of a high side switching device which is one of the first and second switching devices. The low side logic circuit is provided in a low potential part operating on the basis of the low main power potential and configured to generate a control signal on the basis of a signal applied from outside, the control signal having a first state indicating conduction of the high side switching device and a second state indicating non-conduction of the high side switching device, and to generate first and second pulse signals on the basis of the control signal in correspondence with the first and second states, respectively. The first and second level shift parts are configured to level-shift the first and second pulse signals to the high potential part to obtain first and second level-shifted pulse signals, respectively. The voltage detecting device is provided in the low potential part and configured to detect a potential at an output line of at least one of the first and second level shift parts and to supply a logic value based on the potential for the low side logic circuit, thereby controlling an operation of the low side logic circuit.

The voltage detecting device provided in the low potential part detects the potential at an output line of at least one of the first and second level shift parts, that is, the high main power potential. Therefore, in the case where ground-fault occurs at the node between the first and second switching devices, the second pulse signal is generated at that timing to bring the high side switching device into a non-conducting state. Thus, phase fault protection for the high side switching device can be realized at low costs.

A second aspect of the invention is directed to a semiconductor device including a high potential part, a reverse level shift part and a voltage detecting device and performs drive control of first and second switching devices connected in series and interposed between a high main power potential and a low main power potential. The high potential part includes a control part configured to control conduction/non-conduction of a high side switching device which is one of the first and second switching devices. The reverse level shift part is configured to level-shift a signal from the high potential part to supply the level-shifted signal to a low side logic circuit operating on the basis of the low main power potential. The voltage detecting device is provided in the high potential part and configured to detect a potential at an output line of the reverse level shift part and to supply a logic value based on the potential for the control part, thereby causing the control part to control conduction/non-conduction of the high side switching device.

The voltage detecting device provided in the high potential part detects the potential at an output line of the reverse level-shift part, that is, the high main power potential. Therefore, in the case where ground-fault occurs at the node between the first and second switching devices, the control part controls the high side switching device for bringing it into a non-conducting state at that timing, so that the high side switching device is immediately brought into a non-conducting state. Thus, phase fault protection for the high side switching device can effectively be achieved.

A third aspect of the invention is directed to a semiconductor device including a high potential part, a low side logic circuit and a voltage detecting device and performs drive control of first and second switching devices connected in series and interposed between a high main power potential and a low main power potential. The high potential part includes a control part configured to control conduction/non-conduction of a high side switching device which is one of the first and second switching devices. The low side logic circuit is provided in a low potential part operating on the basis of the low main power potential and configured to generate a control signal on the basis of a signal applied from outside, the control signal having a first state indicating conduction of the high side switching device and a second state indicating non-conduction of the high side switching device, and to generate first and second pulse signals on the basis of the control signal in correspondence with the first and second states, respectively. The voltage detecting device is provided in the low potential part and is configured to detect a potential at an output line extending out of the high potential part outputting the high main power potential and to supply a logic value based on the potential for the low side logic circuit, thereby controlling an operation of the low side logic circuit.

The voltage detecting device detects the potential at an output line extending out of the high potential part and outputting the high main power potential, that is, the high main potential. Therefore, in the case where ground-fault occurs at the node between the first and second switching devices, the second pulse signal is generated at that timing to bring the high side switching device into a non-conducting state. Thus, phase fault protection for the high side switching device can be achieved. Further, detection of the potential at the output line extending out of the high potential part increases flexibility in arrangement of the voltage detecting device.

A fourth aspect of the invention is directed to a semiconductor device including a high potential part and a voltage detecting part and performs drive control of first and second switching devices connected in series and interposed between a high main power potential and a low main power potential. The high potential part includes a control part configured to control conduction/non-conduction of a high side switching device which is one of the first and second switching devices. The voltage detecting device is provided in the high potential part and inserted between the high main power potential and a node between the first and second switching devices. The voltage detecting device is configured to detect a potential at the node between the first and second switching devices and to supply a logic value based on the potential for the control part, thereby causing the control part to control conduction/non-conduction of the high side switching device. The voltage detecting device includes at least one MOS transistor whose conduction/non-conduction is controlled on the basis of a potential at an output line extending out of the low potential part outputting the low main power potential.

The voltage detecting device detecting the potential at the node between the first and second switching devices for controlling conduction/non-conduction of the high side switching device is provided in the high potential part. Therefore, in the case where ground-fault occurs at the node between the first and second switching devices, the control part is caused to control the high side switching device for bringing it into a non-conducting state at that timing, so that the high side switching device is immediately brought into a non-conducting state. Thus, phase fault protection for the high side switching device can effectively be achieved.

These and other objects, features, aspects and advantages of the present invention will become more apparent from the following detailed description of the present invention when taken in conjunction with the accompanying drawings.

BRIEF DESCRIPTION OF THE DRAWINGS

FIG. 9 is a table explaining the operation of a majority logic circuit;

DESCRIPTION OF THE PREFERRED EMBODIMENTS

First Preferred Embodiment

1. Circuit Configuration

Figure 1:
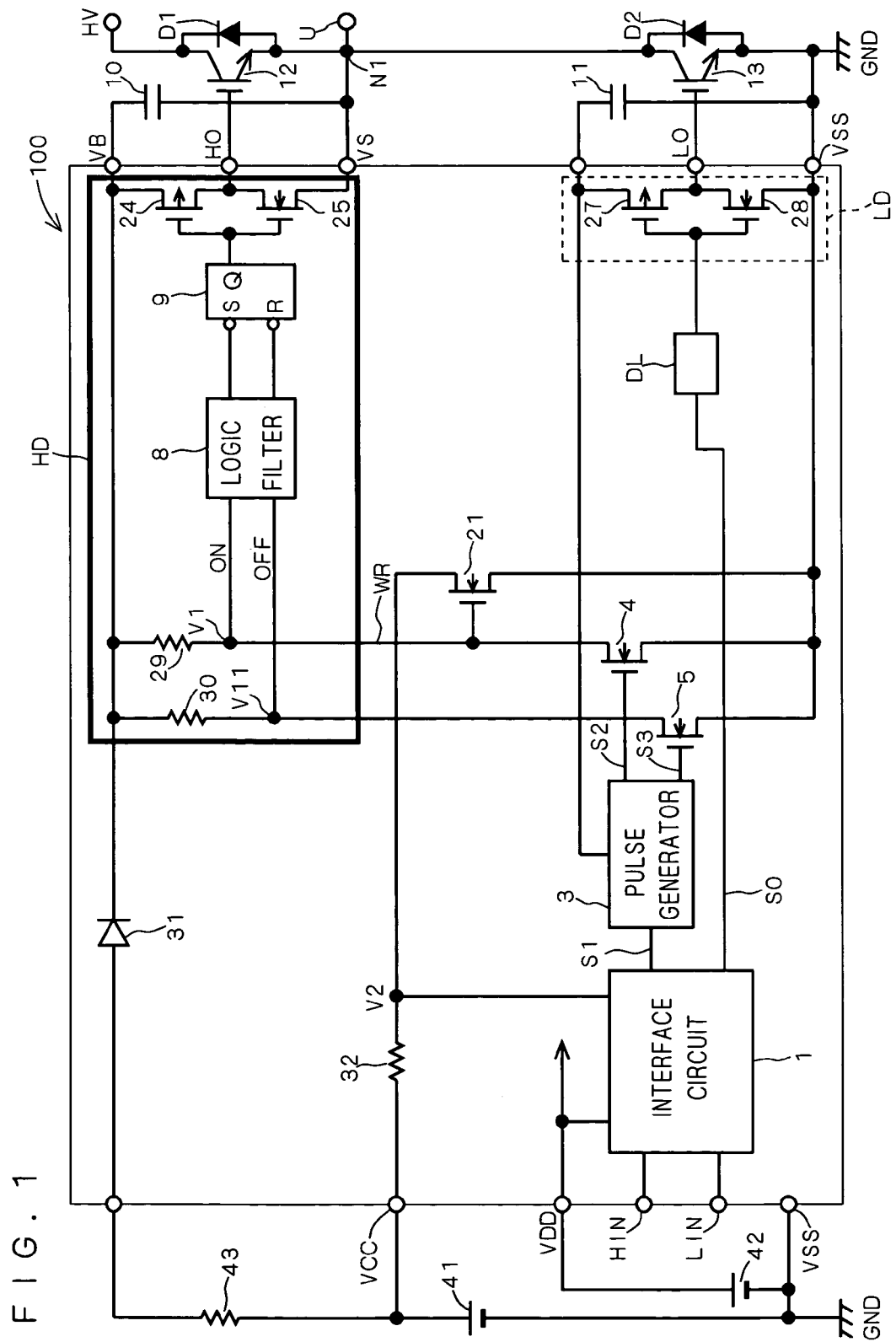
FIG. 1 is an explanatory view illustrating the circuit configuration of an HVIC according to a first preferred embodiment of the present invention.

FIG. 1 illustrates the configuration of a high voltage integrated circuit (HVIC) 100 according to a first preferred embodiment of the present invention.

In FIG. 1, power devices 12 and 13 such as IGBTs (Integrated Gate Bipolar Transistors) are totem-pole-connected between a high side (HV) power line and a low (ground potential GND) side power line, to form a half-bridge power device. Free wheel diodes D1 and D2 are connected inversely in parallel to the power devices 12 and 13, respectively. Then, a load (an inductive load such as a motor) is connected to a node N1 between the power devices 12 and 13.

In FIG. 1, the power device 12 switches between a potential at the node N1 used as a reference potential and the potential (HV) at a high side power line, and is called a high side power device.

The power device 13 switches between the ground potential used as a reference potential and the potential at the node N1, and is called a low side power device.

Therefore, the HVIC 100 shown in FIG. 1 is divided into a high side power device driving circuit HD and a low side power device driving circuit LD.

The high side power device driving circuit HD includes a PMOS transistor 24 and an NMOS transistor 25 constituting a complementary MOS transistor (CMOS transistor) with their source electrodes being respectively connected to two electrodes of a capacitor 10 which is a power supply of the driving circuit HD, and complementarily turns on/off the PMOS transistor 24 and NMOS transistor 25 to switch on/off the power device 12. A voltage at a node between the PMOS transistor 24 and NMOS transistor 25 is called a high side output voltage or control signal HO.

In order to drive the PMOS transistor 24 and NMOS transistor 25, the high side power device driving circuit HD further includes a pulse generator 3 generating a pulse-like ON signal S2 and OFF signal S3, respectively, in response to positive and negative level transitions of a pulse-like control signal S1 (having first and second potential states) supplied from an interface circuit 1 and generated on the basis of the ground potential as the reference potential. The interface circuit 1 generates control signals S1 and S0 respectively on the basis of a high side control signal (HIN signal) and a low side control signal (LIN signal) sent from a microcomputer provided outside. Although illustration is omitted, the HVIC 100 also has the function of receiving a reversely level-shifted signal sent from the high side and outputting the signal to the outside. The pulse generator 3 is also called a one-shot pulse generator. The interface circuit 1 and pulse generator 3 may also generally be called a low side logic circuit.

The pulse generator 3 has its two outputs respectively connected to the gate electrodes of high voltage N-channel field effect transistors (hereinafter referred to as HNMOS transistors) 4 and 5 which are level shift transistors. The ON signal S2 is applied to the gate electrode of the HNMOS transistor 4, and the OFF signal S3 is applied to the gate electrode of the HNMOS transistor 5.

The drain electrodes of the HNMOS transistors 4 and 5 are respectively connected to one terminals of resistors 29 and 30 as well as to inputs of a logic filter 8. The logic filter 8 has its outputs respectively connected to a set input and a reset input of a reverse input SR flip flop circuit 9. Here, the logic filter 8 is a filter circuit for preventing malfunctions of the reverse input SR flip flop circuit 9 and is formed by logic gates.

The reverse input SR flip flop circuit 9 has its Q output connected to the gate electrodes of the PMOS transistor 24 and NMOS transistor 25.

The other terminals of the resistors 29 and 30 are connected to the source electrode of the PMOS transistor 24, i.e., one electrode of the capacitor 10 (a potential here will be referred to as a high side floating power supply absolute potential VB). The drain electrode of the PMOS transistor 24, i.e., the other electrode of the capacitor 10 (a potential here will be referred to as a high side floating power supply offset potential VS) is connected to the node N1.

A dc power supply 41 for supplying a logic circuit voltage VCC for the capacitor 10 is connected to the HVIC 100, and has its positive pole connected to the anode of a high voltage diode 31 through a current-limiting resistor 43. The high voltage diode 31 has its cathode connected to the one electrode of the capacitor 10 (i.e., the source electrode side of the PMOS transistor 24).

The high side power device driving circuit HD operates using charges stored in the capacitor 10, i.e., the logic circuit voltage VCC. When charges stored in the capacitor 10 are reduced to such a degree that cannot maintain the logic circuit voltage VCC, charges are supplied from the dc power supply 41 through the high voltage diode 31, so that the logic circuit voltage VCC is restored. A dc power supply 42 for supplying an operating supply voltage VDD for the interface circuit 1 is also connected to the HVIC 100.

The low side power device driving circuit LD includes a PMOS transistor 27 and an NMOS transistor 28 connected in series between the two electrodes of a capacitor 11 which is a power supply for the driving circuit LD, and complementarily turns on/off the PMOS transistor 27 and NMOS transistor 28 to switch on/off the power device 13. A voltage at a node between the PMOS transistor 27 and NMOS transistor 28 is called a low side output voltage or control signal LO.

The PMOS transistor 27 and NMOS transistor 28 are controlled by the control signal S0 given by the interface circuit 1, while the high side power device driving circuit HD causes a delay of about several tens nanoseconds with respect to an input due to transmission through the above-described complicated paths. Therefore, the low side power device driving circuit LD is designed to be supplied with the control signal S0 through a delay circuit DL so as to have the same input delay as the high side power device driving circuit HD.

Here, the inventor of the present invention paid attention to the fact that a potential V1 at the drain electrode of the HNMOS transistor 4 and a potential V11 at the drain electrode of the HNMOS transistor 5 can be considered substantially equal to the potential VS, and he has reached a technical idea of detecting the potential VS by monitoring the potentials V1 and V11.

More specifically, the potential VS varies between the ground potential level and several hundred volts, while the potential VB represented by VS+VCC varies in accordance with the potential VS. Since the logic circuit voltage VCC is generally set at a constant voltage ranging from 5 to 20V and has a value smaller than the variation range of the potential VS, the potentials VS and VB (i.e., potentials V1 and V11) are substantially equal to each other. Therefore, monitoring the potentials V1 and V11 is substantially equivalent to monitoring the potential VS.

The present invention is based on the aforementioned technical idea. The HVIC 100 shown in FIG. 1 is configured such that the HNMOS transistor 4 has its drain electrode connected to the gate electrode of an NMOS transistor 21, the logic circuit voltage VCC is applied to the drain electrode of the NMOS transistor 21 through a resistor 32, and the ground potential is supplied to the source electrode of the NMOS transistor 21. A drain potential V2 of the NMOS transistor 21 is monitored by the interface circuit 1, thereby indirectly monitoring the potential VS.

2. Circuit Operation

Next, a normal operation of the HVIC 100 will be described referring to the timing chart shown in FIG. 2. Since the operation of the low side power device driving circuit LD is the same as a conventional one, the following description will be concentrated on the operation of the high side power device driving circuit HD.

Figure 2:
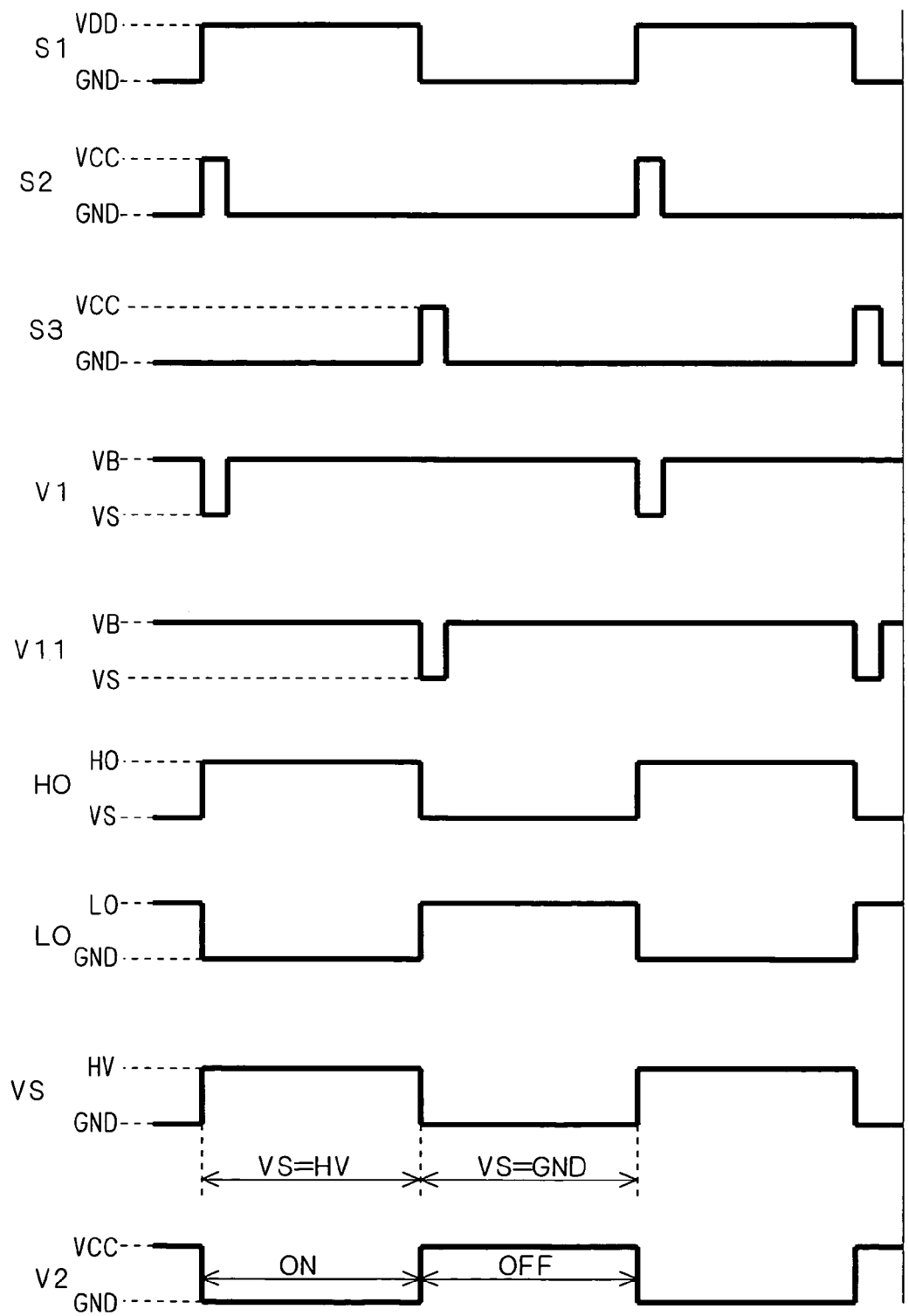
FIGS. 2 and 3 are timing charts explaining the operation of the HVIC according to the first preferred embodiment.

In FIG. 2, the pulse generator 3 sequentially generates one-shot pulses as the ON signal S2 and OFF signal S3, respectively, in response to level transitions of the pulse-like control signal S1 between negative (GND) and positive (VDD) levels.

First, the ON signal S2 as a pulse signal changing to an "H" state (high potential, i.e., VCC) is supplied. At this time, the OFF signal S3 is in an "L" state (low potential, i.e., GND), and the HNMOS transistor 4 is turned on by the ON signal S2. The HNMOS transistor 5 is in an off state.

Then, a voltage drop occurs at the resistor 29 connected to the HNMOS transistor 4, causing the potential V1 at the drain electrode of the HNMOS transistor 4 to drop from the potential VB to the potential VS.

On the other hand, no voltage drop occurs at the resistor 30 connected to the HNMOS transistor 5, so that "H" signals (having potential VB) are continuously inputted to the other input of the logic filter 8.

Similarly, when supplied with the OFF signal S3 as a pulse signal changing to an "H" state (high potential, i.e., VCC), the HNMOS transistor 5 is turned on. The HNMOS transistor 4 is in an off state.

Then, a voltage drop occurs at the resistor 30 connected to the HNMOS transistor 5, causing the potential V11 at the drain electrode of the HNMOS transistor 5 to drop from the potential VB to the potential VS.

An output signal from the reverse input SR flip flop circuit 9 is changed to an "H" state (i.e., potential VB) at the timing when the ON signal S2 is supplied and to an "L" state (i.e., potential VS) at the timing when the OFF signal S3 is supplied.

The control signal HO for the power device 12 obtained by complementarily turning on/off the PMOS transistor 24 and NMOS transistor 25 is similar to the control signal S1. FIG. 2 also shows the control signal LO for the power device 13.

The potential at the node N1 is changed between the high potential (HV) and ground potential (GND) by the complementary operations of the power devices 12 and 13. The timing of change follows the timing when the control signal HO for the power device 12 changes.

In the aforementioned normal operation of the HVIC 100, the drain potential V2 of the NMOS transistor 21 is an output corresponding to the change in potential at the node N1.

That is, when the potential at the node N1 is changed to the high potential (HV), the NMOS transistor 21 provided as a voltage detector is brought into an on state, causing the drain potential V2 to be changed to GND.

On the other hand, when the potential at the node N1 is changed to GND, the NMOS transistor 21 is brought into an off state, causing the drain potential V2 to be changed to the logic circuit voltage VCC. As described, an output corresponding to the potential VS at the node N1 is obtained from the NMOS transistor 21, enabling indirect monitoring of the potential VS.

Next, an abnormality detecting operation in the case where ground-fault occurs at the node N1 will be described referring to the timing chart shown in FIG. 3.

Figure 3:
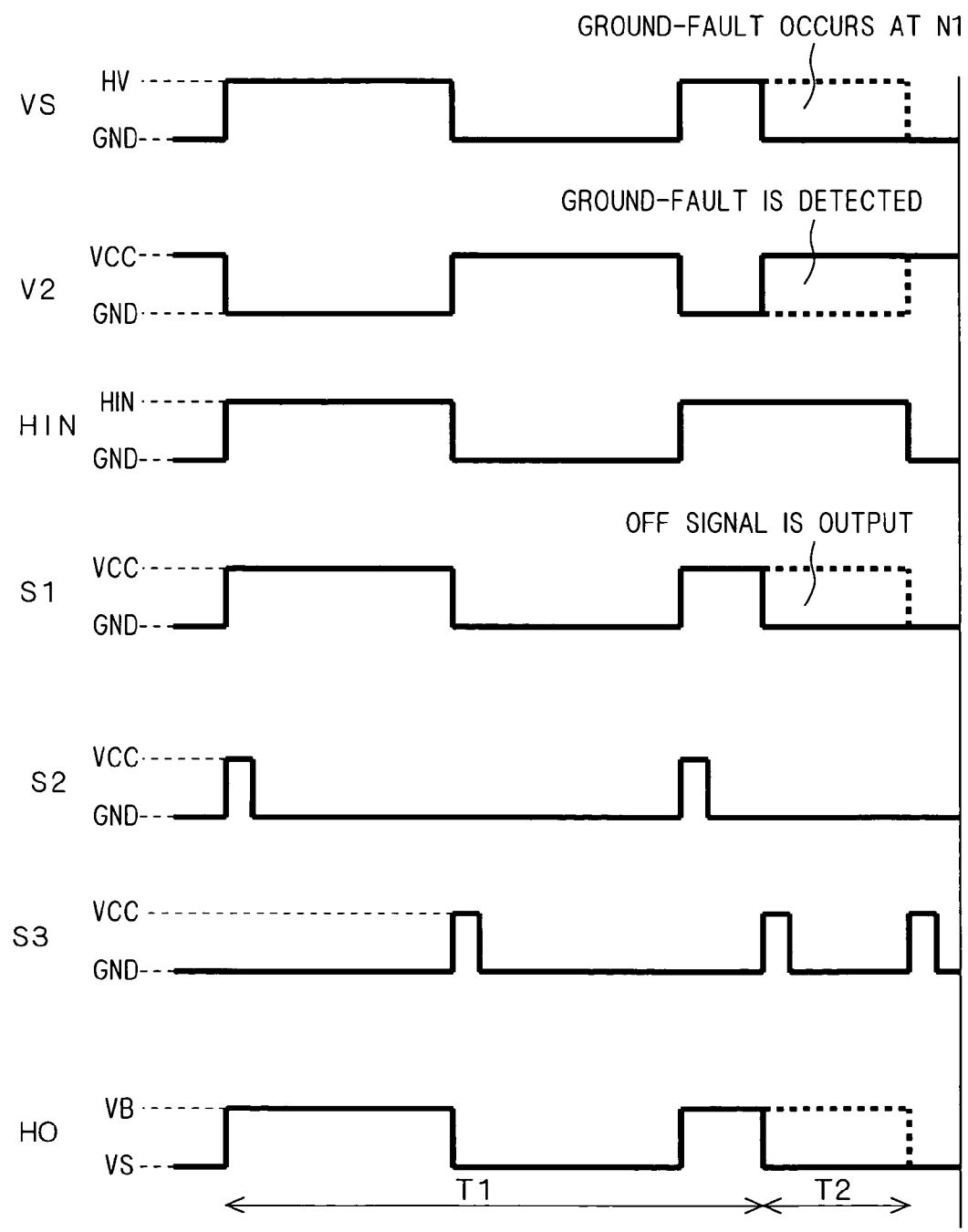

As shown in FIG. 3, when ground-fault occurs at the node N1 after a lapse of a normal operation state (period T1), the potential at the node N1 drops from the high potential (HV) to the ground potential (GND) (period T2).

With this change, the NMOS transistor 21 is brought into an off state, causing the drain potential V2 to be changed to the logic circuit voltage VCC. The drain potential V2, being monitored by the interface circuit 1, is subjected to a NAND operation with an HIN signal, for example, which allows the control signal S1 to be an OFF signal in accordance with the timing when the node N1 is grounded. This allows the pulse generator 3 to generate the OFF signal S3 at the timing when the node N1 is grounded, so that the control signal HO for the power device 12 which is in a short-circuit state can be stopped to turn off the power device 12. Therefore, the HVIC 100 has the function of phase fault protection.

3. Exemplary Configuration

Next, an exemplary configuration of the HVIC 100 will be described referring to FIGS. 4 and 5.

Figure 4:
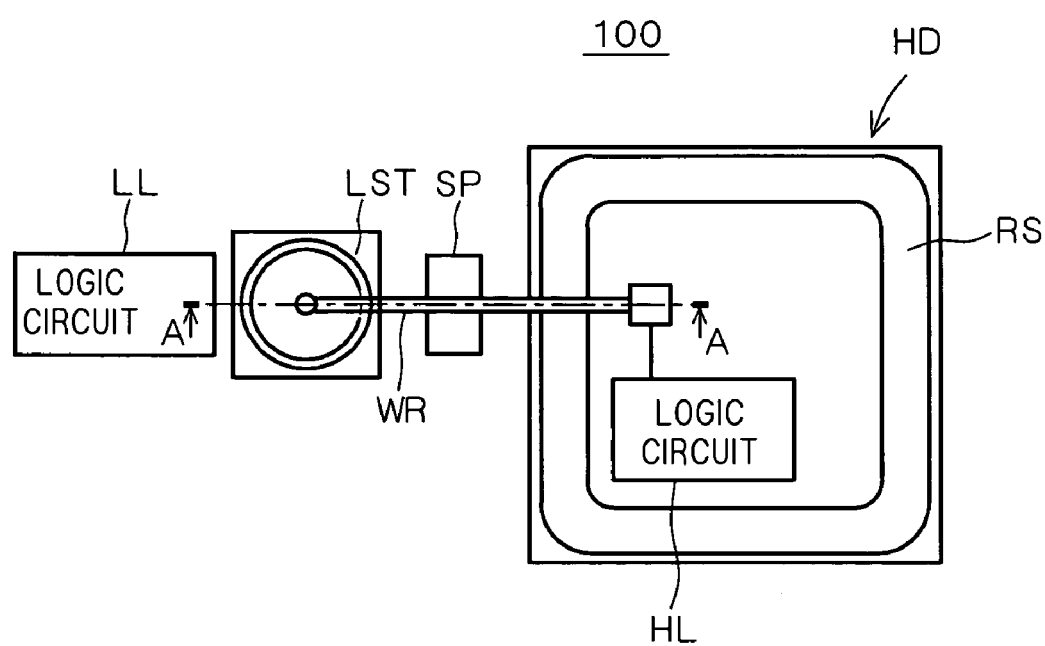
FIG. 4 is a plan view illustrating the structure of the HVIC according to the first preferred embodiment.

FIG. 4 is a plan view of the plane configuration of the HVIC 100 on a main surface of a semiconductor substrate, illustrating the high side power device driving circuit HD, a voltage sensor part SP in which a voltage detector such as the NMOS transistor 21 is provided, a high voltage level shift transistor LST such as the HNMOS transistor 4 and a low side logic circuit LL. FIG. 4 is a schematic view, and the size of respective components and the spacing with which they are arranged differ in a real device.

Although not shown in FIG. 1, the low side logic circuit LL includes a circuit for receiving a signal sent to the low side in response to level shift (reverse level shift) from the high side power device driving circuit HD and judging the received signal as well as a circuit for outputting the signal to the outside. Signals output from the high side include a signal indicative of operating conditions of the high side power device driving circuit HD.

As shown in FIG. 4, the high side power device driving circuit HD is surrounded by an isolation structure RS called a RESURF (Reduced Surface Field) structure and is electrically isolated from the low side.

In such structure, transmitting signals between the logic circuit (e.g., the logic filter 8 shown in FIG. 1) in the high side power device driving circuit HD and the low side is carried out through a high side interconnect line (output line) WR extending over the isolation structure RS.

For instance, considering the level shift transistor LST to be the HNMOS transistor 4 shown in FIG. 1, the drain electrode of the HNMOS transistor 4 shall be connected to the logic filter 8 in the high side power device driving circuit HD through the high side interconnect line WR.

Paying attention to this configuration and making the use of the fact that the potential at the high side interconnect line WR is the potential V1 to be detected, the inventor of the present invention has reached a technical idea of detecting the potential V1, i.e., the potential VS in the low side region by causing the high side interconnect line WR to function as the gate of a MOS transistor which is a voltage detector.

More specifically, as shown in FIG. 4, the voltage sensor part SP is arranged with the high side interconnect line WR extending over the voltage sensor part SP, the high side interconnect line WR is used as a gate electrode, and source/drain layers are provided on its both sides, so that a MOS transistor as a voltage detector is formed.

Figure 5:
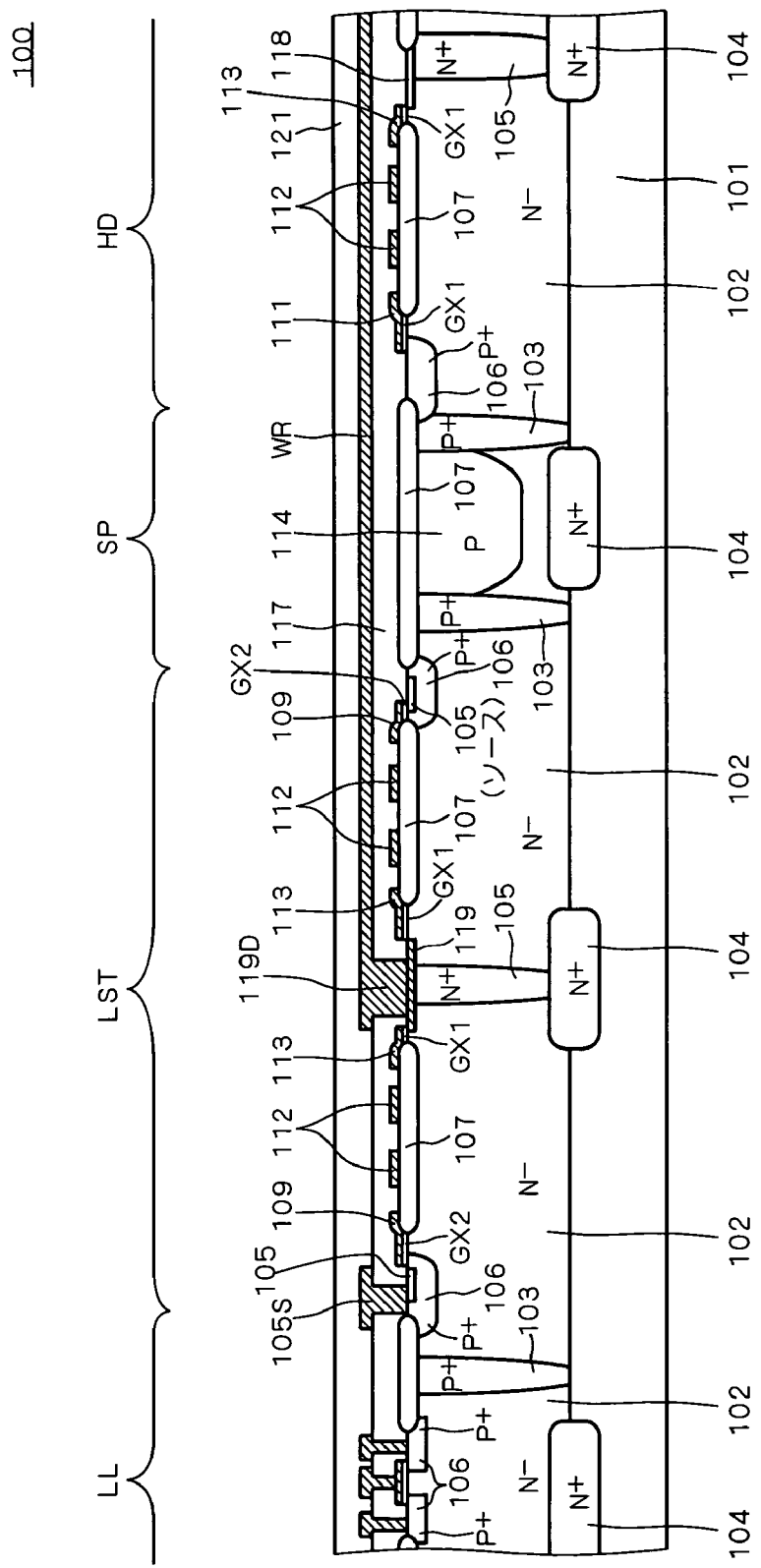
FIG. 5 is a sectional view illustrating the structure of the HVIC according to the first preferred embodiment.

FIG. 5 illustrates an example of a sectional structure taken along the line A—A of FIG. 4.

In FIG. 5, an epitaxial layer 102 (including a relatively low concentration of N-type impurities: N$^-$) is provided on a main surface of a semiconductor substrate 101 (including a relatively low concentration of P-type impurities: P$^-$) such as a silicon substrate. A buried diffusion region 104 (including a relatively high concentration of N-type impurities: N$^+$) for field relieving are selectively formed to straddle the border between the epitaxial layer 102 and semiconductor substrate 101.

FIG. 5 shows the sectional structure of part of the isolation structure RS surrounding the high side power device driving circuit HD, voltage sensor part SP, level shift transistor LST and low side logic circuit LL. The isolation structure RS will be described first.

The isolation structure RS includes a field oxide film 107 selectively provided on a surface of the epitaxial layer 102, a P-type diffusion region 106 (including a relatively high concentration of P-type impurities: P$^+$) provided in the surface of the epitaxial layer 102 at an interval from the field oxide film 107, an N-type diffusion region 118 (N$^+$) provided in the surface of the epitaxial layer 102 on the opposite side of the P-type diffusion region 106 with respect to the field oxide film 107, a low side polysilicon field plate 111 provided to extend over from an edge of the field oxide film 107 to an edge of the P-type diffusion region 106, a plurality of floating potential polysilicon field plates 112 selectively provided on the field oxide film 107, and a high side polysilicon field plate 113 provided to extend over from an edge of the field oxide film 107 to an edge of the N-type diffusion region 118.

In this way, the employment of a multi-field plate structure in which plates having different potentials are provided at intervals allows electric field concentration to be relieved.

The low side polysilicon field plate 111 and high side polysilicon field plate 113 are respectively provided on gate oxide films GX1.

The N-type diffusion region 118 is provided to partly overlap an N-type diffusion region 105 (N$^+$) extending from the main surface of the epitaxial layer 102 to reach the buried diffusion region 104. The N-type diffusion region 105 is provided for fixing the potential at the buried diffusion region 104.

The voltage sensor part SP includes a field oxide film 107 selectively provided on the epitaxial layer 102, a P-well region 114 provided in the surface of the epitaxial layer 102 covered with the field oxide film 107 and a P-type diffusion region 103 (P$^+$) provided to be in contact with and surround the P-well region 114, extending from the main surface of the epitaxial layer 102 to reach the surface of the semiconductor substrate 101. A buried diffusion region 104 is provided under the P-well region 114. The voltage sensor part SP has source/drain regions, which do not appear in the cross section shown in FIG. 5. The structure of the voltage sensor part SP will be described later in detail.

The level shift transistor LST employs the multi-field plate structure for field relieving similarly to the isolation structure RS. That is, an N-type diffusion region 119 (N$^+$) provided in the surface of the epitaxial layer 102 serves as a drain region, and a field oxide film 107 is provided at an interval from the N-type diffusion region 119 to concentrically surround the N-type diffusion region 119. Then, a P-type diffusion region 106 to be a well region is concentrically provided in the surface of the epitaxial layer 102 on the periphery of the concentrically provided field oxide film 107. An N-type diffusion region 105 (N$^+$) to be a source region is concentrically provided in the surface of the P-type diffusion region 106.

Then, a high side polysilicon field plate 113 is provided to extend over from an inner edge of the field oxide film 107 to an edge of the N-type diffusion region 119. A plurality of floating potential polysilicon field plates 112 are concentrically provided on the field oxide film 107. A gate electrode 109 is concentrically provided to extend over from an outer edge of the field oxide film 107 to an edge of the N-type diffusion region 105.

The high side polysilicon field plate 113 and gate electrode 109 are provided on gate oxide films GX1 and GX2, respectively.

The N-type diffusion region 119 overlaps the N-type diffusion region 105 extending from the main surface of the epitaxial layer 102 to reach a buried diffusion region 104.

A field oxide film 107 is provided on the surface of the epitaxial layer 102 between the level shift transistor LST and low side logic circuit LL, and a P-type diffusion region 103 is provided to extend from the main surface of the epitaxial layer 102 covered with the field oxide film 107 to reach the surface of the semiconductor substrate 101.

Although the low side logic circuit LL employs various structures according to functions, explanation of such structures is omitted here since they are little pertinent to the present invention, however, it is needless to say that the low side logic circuit LL at least includes a PMOS transistor having a P-type diffusion region 106 formed in the surface of the epitaxial-layer 102 as source/drain regions, as shown in FIG. 5.

Then, an interlayer insulating film 117 made of, e.g., a silicon oxide film is provided to entirely cover the main surface of the epitaxial layer 102.

In the level shift transistor LST, a drain electrode 119D is provided to extend through the interlayer insulating film 117 to reach the N-type diffusion region (drain region) 119, and a source electrode 105S is provided to extend through the interlayer insulating film 117 to reach the N-type diffusion region (source region) 105.

Provided on the interlayer insulating film 117 is the high side interconnect line WR extending over the voltage sensor part SP and isolation structure RS with one end connected to the drain electrode 119D and the other end extending into the high side power device driving circuit HD. The high side interconnect line WR is made of a conductor such as aluminum.

Further, a passivation film (glass coat film) 121 is provided to cover the high side interconnect line WR and interlayer insulating film 117.

Figure 6:
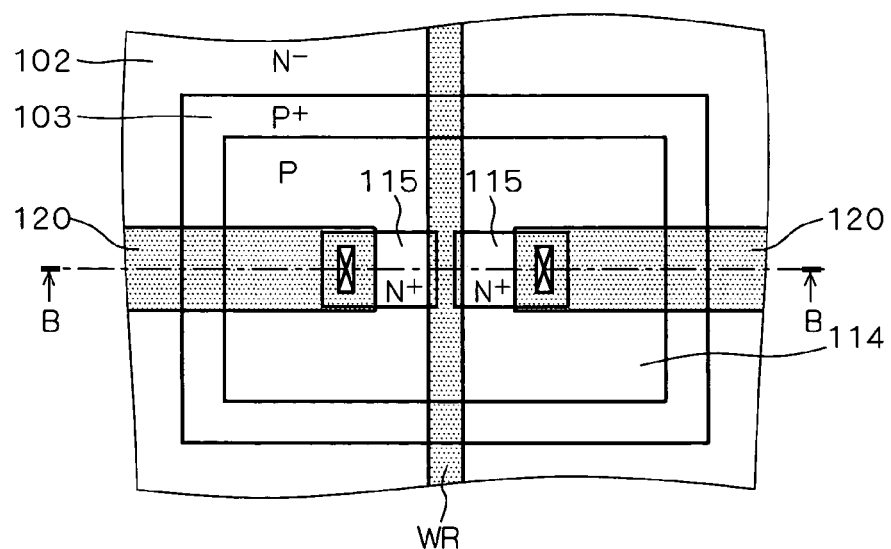
FIG. 6 is a plan view illustrating the structure of a voltage detector of the HVIC according to the first preferred embodiment.
Figure 7:
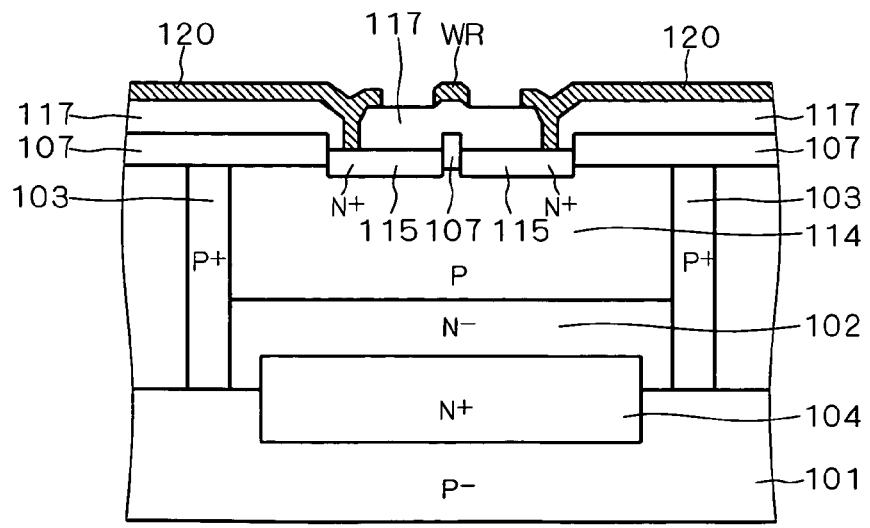
FIG. 7 is a sectional view illustrating the structure of the voltage detector of the HVIC according to the first preferred embodiment.

Next, referring to FIGS. 6 and 7, a structure in which the NMOS transistor 21 shown in FIG. 1 is used as the voltage sensor part SP will specifically be described.

FIG. 6 is a plan view illustrating the plane structure of the NMOS transistor 21 in more detail. For ease of description, an impurity region formed in the surface of the epitaxial layer 102 is also illustrated. FIG. 7 illustrates the sectional structure of the NMOS transistor 21 shown in FIG. 6 taken along the line B—B.

As shown in FIG. 6, the NMOS transistor 21 is provided on the P-well region 114 formed in the surface of the epitaxial layer 102, and N-type diffusion regions 115 ($N^+$) are selectively formed as source/drain regions in the surface of the P-well region 114 on the both sides of the high side interconnect line WR. The P-well region 114 is surrounded by the P-type diffusion region 103.

Then, source/drain electrodes 120 of, e.g., aluminum are formed over the N-type diffusion regions 115 and are electrically connected to the N-type diffusion regions 115. One of the source/drain electrodes 120 is grounded.

Further, as shown in FIG. 7, the forming region of the N-type diffusion regions 115 is defined by the field oxide film 107, and the interlayer insulating film 117 is provided to cover the field oxide film 107. The high side interconnect line WR is provided over the field oxide film 107 and interlayer insulating film 117 to extend over edges of the two N-type diffusion regions 115 so as to function as a gate electrode.

In such structure, the interlayer insulating film 117 and field oxide film 107 under the high side interconnect line WR function as a gate oxide film, and the voltage sensor part SP shall have a so-called field transistor as a voltage detector.

That is, the potential VS (approximating the potential V1) to be measured reaches several hundred volts. On the other hand, a MOS transistor used in a general logic circuit, etc., has a gate oxide film of a thickness not greater than 100 nm. If a gate oxide film of this thickness is used for a voltage detector, dielectric breakdown will occur.

Therefore, the use of the field oxide film 107 and interlayer insulating film 117 far thicker than a general gate oxide film leads to a field transistor that does not cause dielectric breakdown even with several hundred volts are applied to the high side interconnect line WR.

Here, the total thickness of the field oxide film 107 and interlayer insulating film 117 reaches 1 μm. If only one of the field oxide film 107 and interlayer insulating film 117 has a sufficient thickness to withstand a voltage applied to the high side interconnect line WR, the very one of the field oxide film 107 and interlayer insulating film 117 may be used as a gate oxide film.

When a high voltage is applied to the high side interconnect line WR, the surface of the P-well region 114 under the field oxide film 107 is reversed to an N-type region, and a channel region is formed between the N-type diffusion regions 105. Then, the NMOS transistor 21 is turned on, causing the drain potential V2 to be changed to GND. Accordingly, phase fault protection for the HVIC 100 is carried out.

4. First Modification

Although the use of an NMOS transistor as a voltage detector has been described above by way of example, a PMOS transistor may be used instead. In this case, connecting the resistor 32 shown in FIG. 1 to the GND terminal, the drain of the PMOS transistor to the resistor 32, and the source to the VCC terminal, and performing a NAND operation of the drain potential V2 and HIN signal, the control signal S1 can be made an OFF signal at the timing when ground-fault occurs at the node N1.

Further, the use of an enhancement type MOS transistor as a voltage detector has been described by way of example, a depression type MOS transistor may be used instead.

When the potential VS becomes negative, an enhancement MOS transistor cannot detect it, however, a depression type MOS transistor, for example, is brought into an off state when the potential VS becomes negative, and thus can detect a negative potential VS.

5. Second Modification

Figure 8:
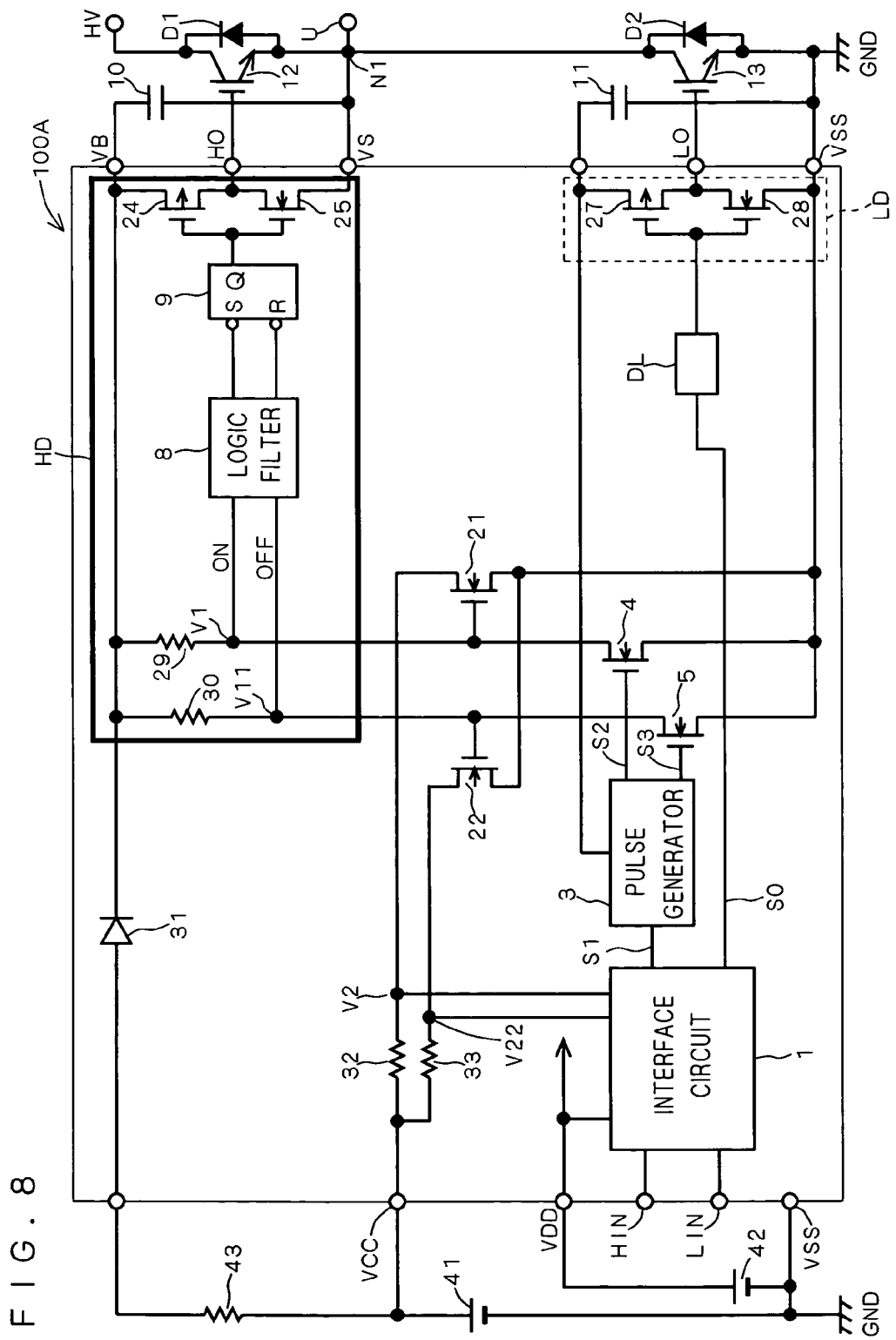
FIG. 8 is an explanatory view illustrating the circuit configuration of a second modification of the HVIC according to the first preferred embodiment.

Although the NMOS transistor 21 performing on/off control based on the drain potential at the HNMOS transistor 4 as shown in FIG. 1 has been described above, an NMOS transistor 22 performing on/off control based on the drain potential at the HNMOS transistor 5 may additionally be incorporated as in an HVIC 100A shown in FIG. 8.

In this case, the logic circuit voltage VCC is applied to the drain electrode of the NMOS transistor 22 through a resistor 33, and the ground potential is applied to the source electrode of the NMOS transistor 22. The potential VS is monitored indirectly also by monitoring a drain potential V22 at the NMOS transistor 22 by the interface circuit 1. Components shown in FIG. 8 similar to those in the HVIC 100 in FIG. 1 are indicated by the same reference numerals, repeated explanation of which is thus omitted here.

As described, providing a plurality of voltage detectors for monitoring the potential VS achieves redundancy, which can prevent the possibility of failure in monitoring the potential VS.

Further, for providing voltage detectors with redundancy, a plurality of NMOS transistors similar to the NMOS transistor 21 performing on/off control based on the drain potential at the HNMOS transistor 4 shown in FIG. 1 are connected in parallel to each other so as to provide an odd number of voltage detectors, each drain potential of which is applied to an input of a majority logic circuit.

A majority logic circuit here stands for a circuit formed by a plurality of logic gates for outputting the majority of logic values of input signals.

As an example of such majority logic circuit, a truth table of a three-input majority logic circuit is shown in FIG. 9.

FIG. 9 shows outputs Y in response to three inputs A, B and C. It is apparent that the majority of logic values is a logic value of an output Y.

With such configuration, the majority logic circuit outputs a correct logic value if one of a plurality of voltage detectors malfunctions to output a wrong logic value. This can further prevent the possibility of failure in monitoring the potential VS.

6. Third Modification

Figure 10:
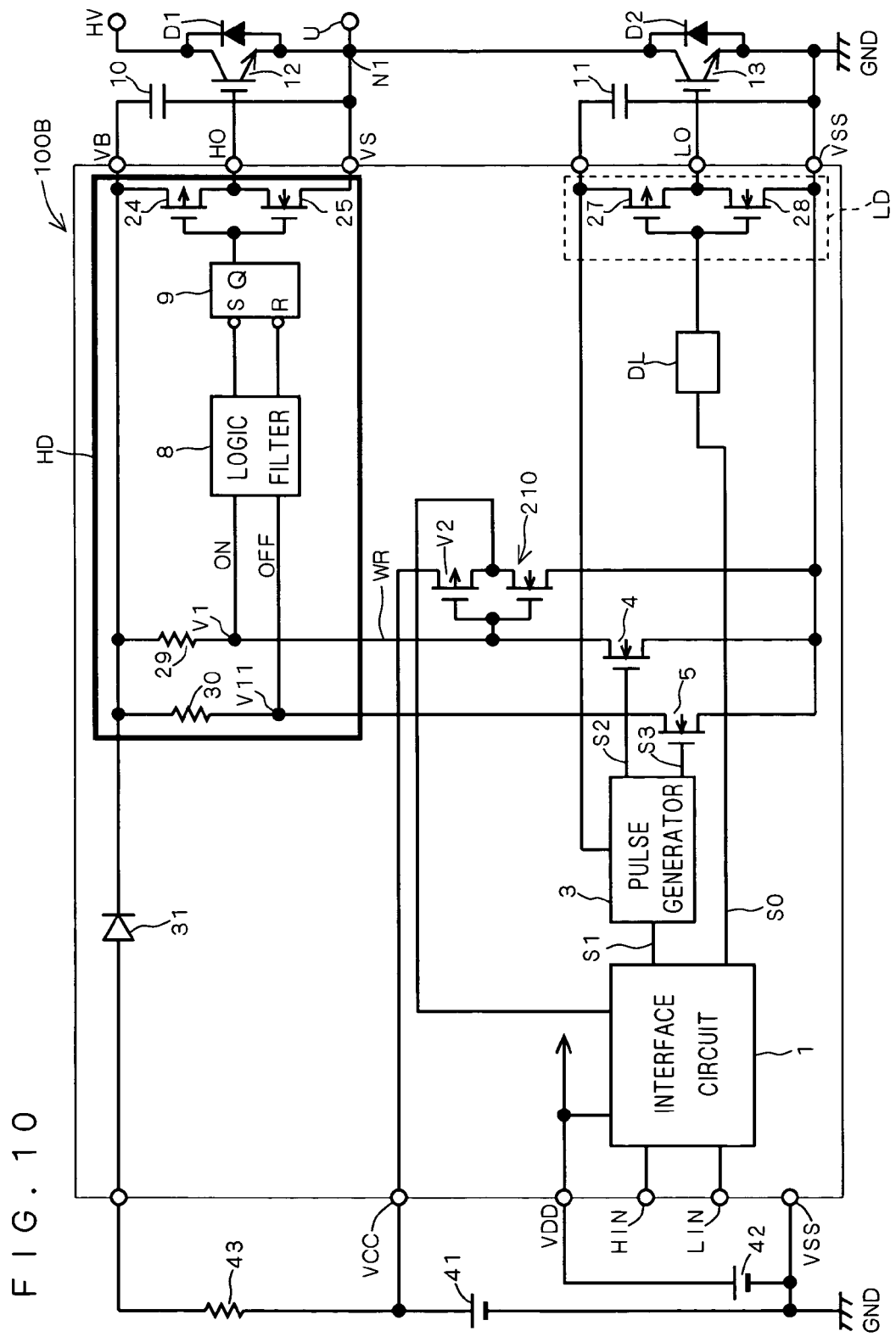
FIG. 10 is an explanatory view illustrating a third modification of the HVIC according to the first preferred embodiment.

Although the use of an NMOS transistor or PMOS transistor as a voltage detector has been described by way of example, a CMOS transistor such as an HVIC 100B shown in FIG. 10 may be used instead. Components shown in FIG. 10 similar to those in the HVIC 100 in FIG. 1 are indicated by the same reference numerals, repeated explanation of which is thus omitted here.

As shown in FIG. 10, the HNMOS transistor 4 has its drain electrode connected to a common gate electrode of a CMOS transistor 210, and the logic circuit voltage VCC is applied to the source electrode of a PMOS transistor constituting the CMOS transistor 210. A ground potential is applied to the source electrode of an NMOS transistor constituting the CMOS transistor 210. The drain potential V2 at the CMOS transistor 210 is monitored by the interface circuit 1, so that the potential VS is monitored indirectly.

With such configuration, when the potential V1 is changed to GND, the PMOS transistor constituting the CMOS transistor 210 is brought into an on state, but the NMOS transistor is in an off state. Therefore, the CMOS transistor 210 outputs the logic circuit voltage VCC. Performing a NAND operation of the outputted logic circuit voltage VCC and an HIN signal, for example, the control signal S1 can be made an OFF signal at the timing when ground-fault occurs at the node N1.

The use of the CMOS transistor as a voltage detector can advantageously reduce current in the circuit.

Next, referring to FIGS. 11 to 13, the structure of the CMOS transistor 210 will be described.

Figure 11:
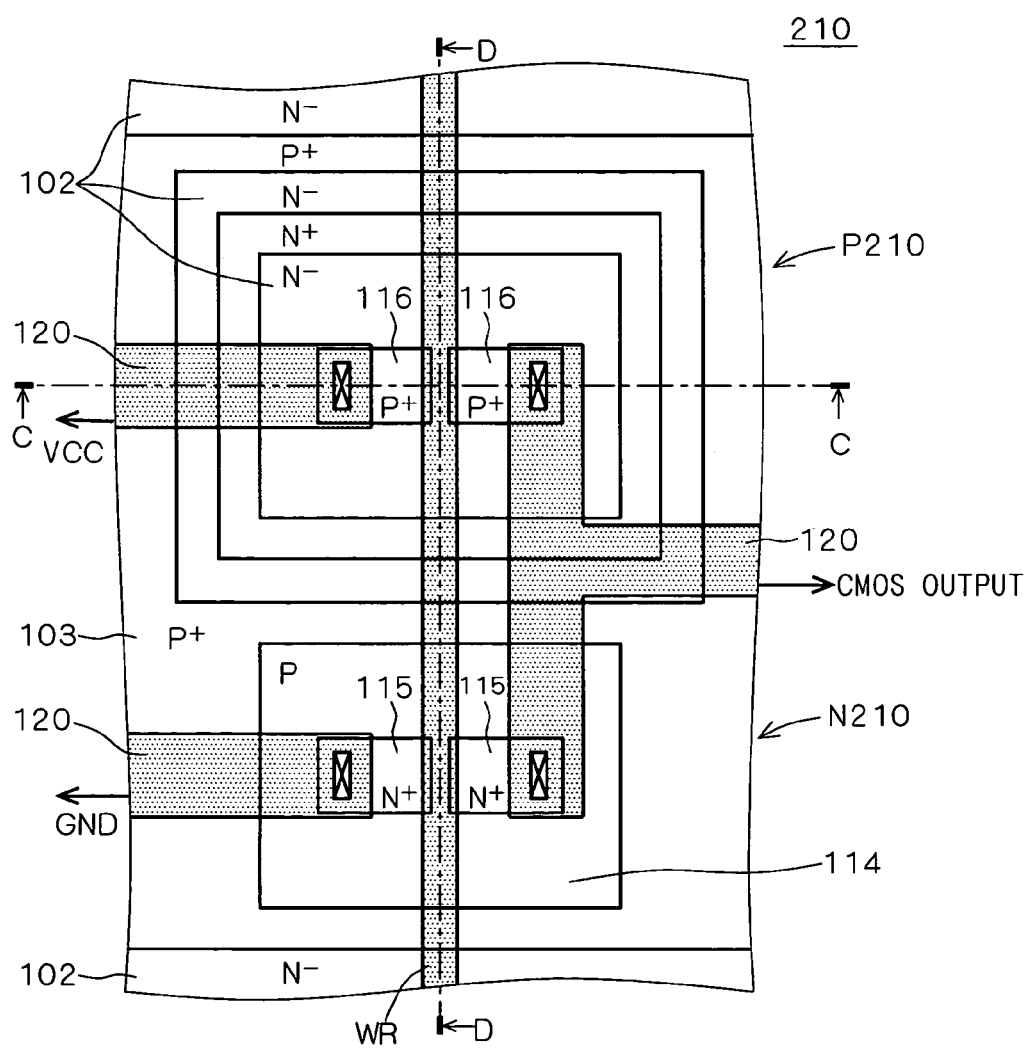
FIG. 11 is a plan view illustrating the structure of a voltage detector of the third modification of the HVIC according to the first preferred embodiment.

FIG. 11 is a plan view illustrating the plane structure of the CMOS transistor 210, and for ease of description, also illustrates an impurity region formed in the surface of the epitaxial layer 102. FIGS. 12 and 13 illustrate the sectional structures of the CMOS transistor 210 shown in FIG. 11 taken along the lines C—C and D—D, respectively.

As shown in FIG. 11, the CMOS transistor 210 is constituted by a PMOS transistor P210 provided on the epitaxial layer 102 surrounded by an N-type diffusion region 125 ($N^+$) and an NMOS transistor N210 provided on the P-well region 114 formed in the surface of the epitaxial layer 102.

In the PMOS transistor P210, P-type diffusion regions 116 ($P^+$) as source/drain regions are selectively provided in the surface of the epitaxial layer 102 on the both sides of the high side interconnect line WR. Then, the source/drain electrodes 120 of, e.g., aluminum are formed over the P-type diffusion regions 116 and are electrically connected to the P-type diffusion regions 116. One of the source/drain electrodes 120 is also connected to source/drain regions of the NMOS transistor N210, which is to be an output of the CMOS transistor 210.

The N-type diffusion region 125 surrounding the central part of the epitaxial layer 102 is surrounded by the epitaxial layer 102, and the epitaxial layer 102 is surrounded by the P-type diffusion region 103.

In the NMOS transistor N210, the N-type diffusion regions 115 are selectively formed as source/drain regions in the surface of the P-well region 114 on the both sides of the high side interconnect line WR. The source/drain electrodes 120 of, e.g., aluminum are formed over the N-type diffusion regions 115 and are electrically connected to the N-type diffusion regions 115. One of the source/drain electrodes 120 is also connected to the P-type diffusion region 116 of the PMOS transistor P210. The epitaxial layer 102 is surrounded by the P-type diffusion region 103.

Figure 12:
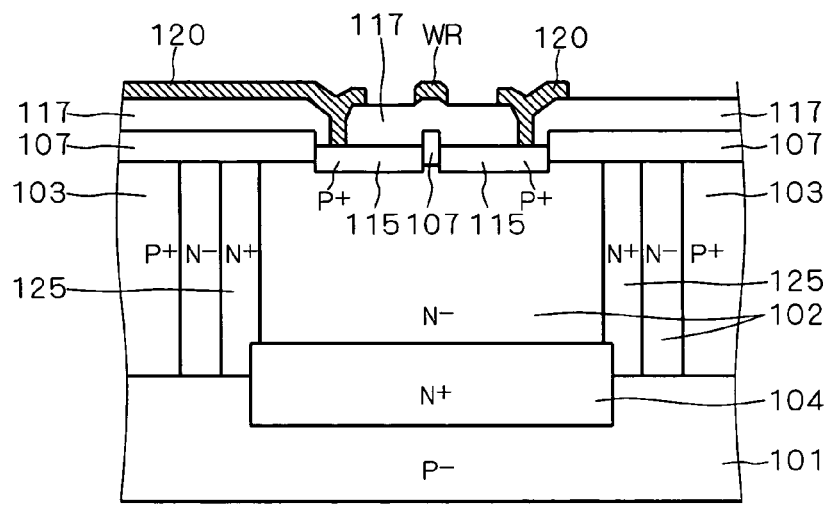
FIGS. 12 and 13 are sectional views illustrating the structure of the voltage detector of the third modification of the HVIC according to the first preferred embodiment.
Figure 13:
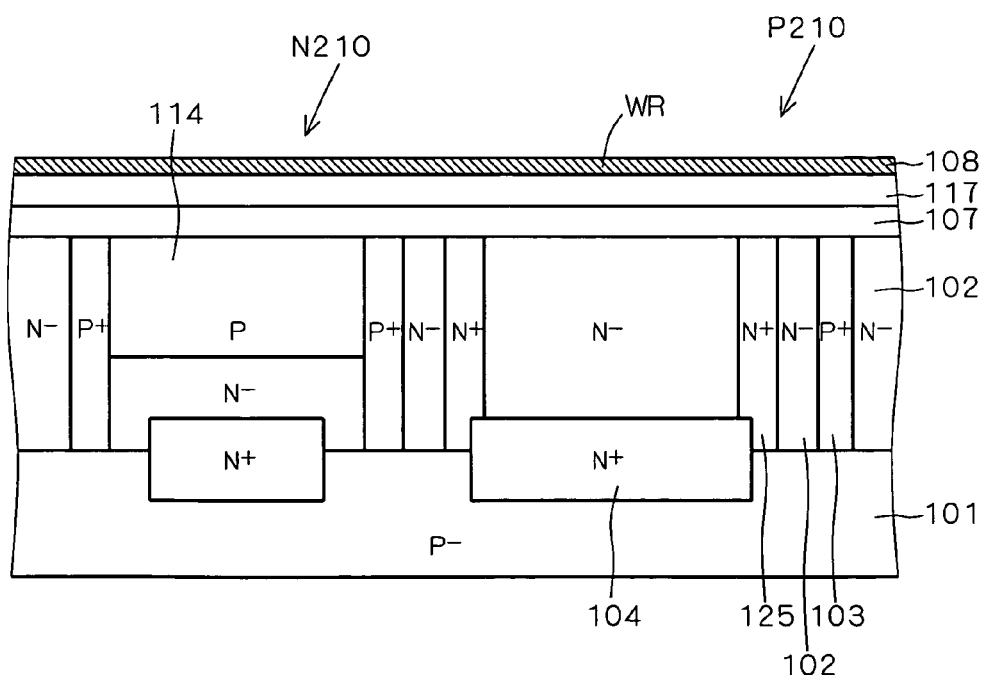

As shown in FIGS. 12 and 13, the forming region of the P-type diffusion region 116 is defined by the field oxide film 107, and the interlayer insulating film 117 is provided to cover the field oxide film 107. The high side interconnect line WR is provided over the field oxide film 107 and interlayer insulating film 117 to extend over edges of the two P-type diffusion regions 116 so as to function as a gate electrode.

The N-type diffusion region 125 surrounding the central part of the epitaxial layer 102 is provided to extend from the main surface of the epitaxial layer 102 to reach the semiconductor substrate 101 and to be in contact with the buried diffusion region 104 for completely separating the central part of the epitaxial layer 102 from P-type impurity regions. The sectional structure of the NMOS transistor N210 is the same as the NMOS transistor 21 described referring to FIG. 7, repeated explanation of which is thus omitted here.

7. Fourth Modification

Figure 14:
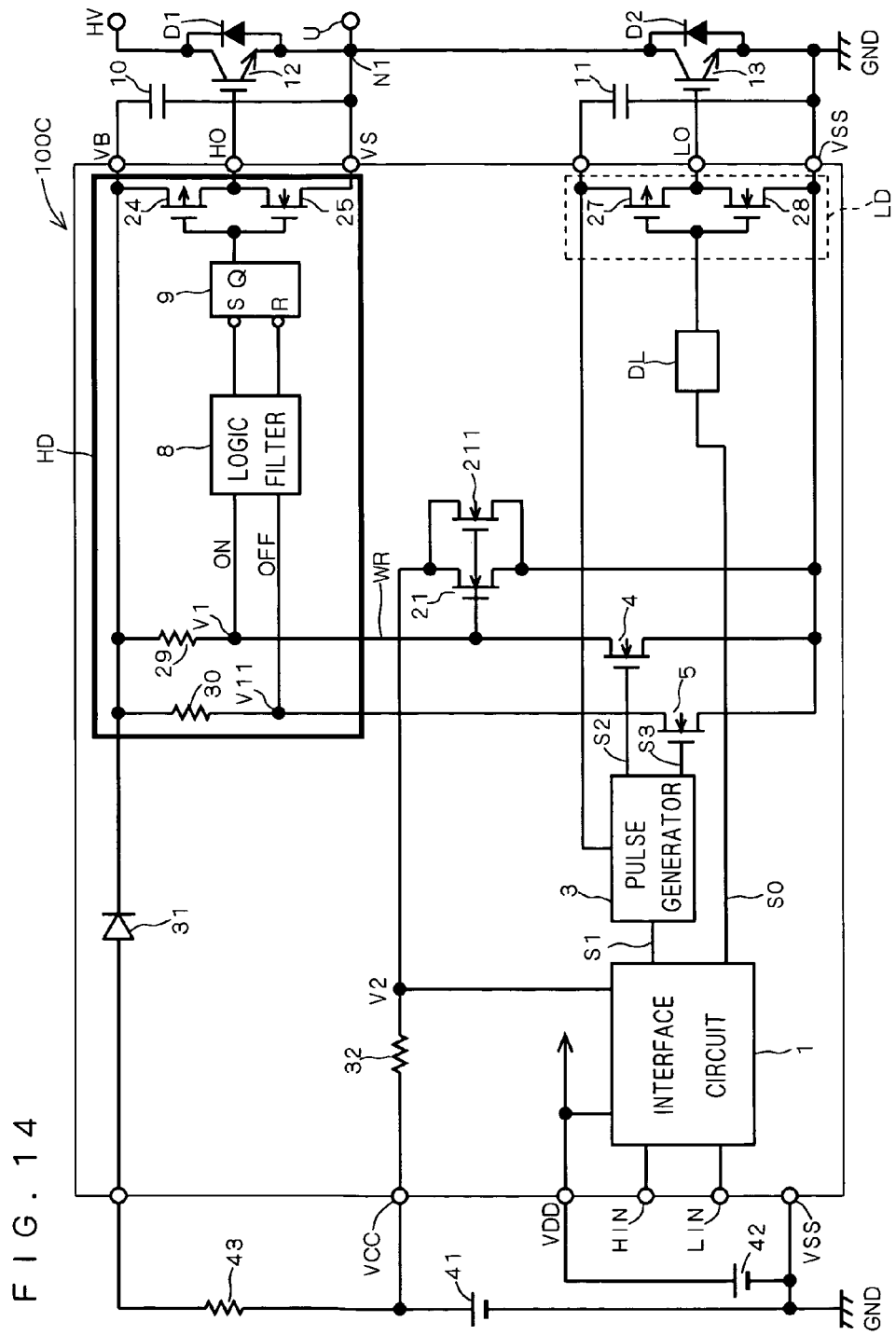
FIG. 14 is an explanatory view illustrating the circuit configuration of a fourth modification of the HVIC according to the first preferred embodiment.

Although the above description has been directed to the structure in which the voltage VS of one level is to be detected, a plurality of NMOS transistors (NMOS transistors 21 and 211 in this case) having different threshold voltages from each other may be connected in parallel, as in an HVIC 100C shown in FIG. 14, so that a plurality of detection levels of the potential VS can be set. Components shown in FIG. 14 similar to those in the HVIC 100 in FIG. 1 are indicated by the same reference numerals, repeated explanation of which is thus omitted here.

Now, referring to FIGS. 15 and 16, an exemplary structure of the NMOS transistors 21 and 211 will be described.

7-1. Change in Thickness of Gate Oxide Film

Figure 15:
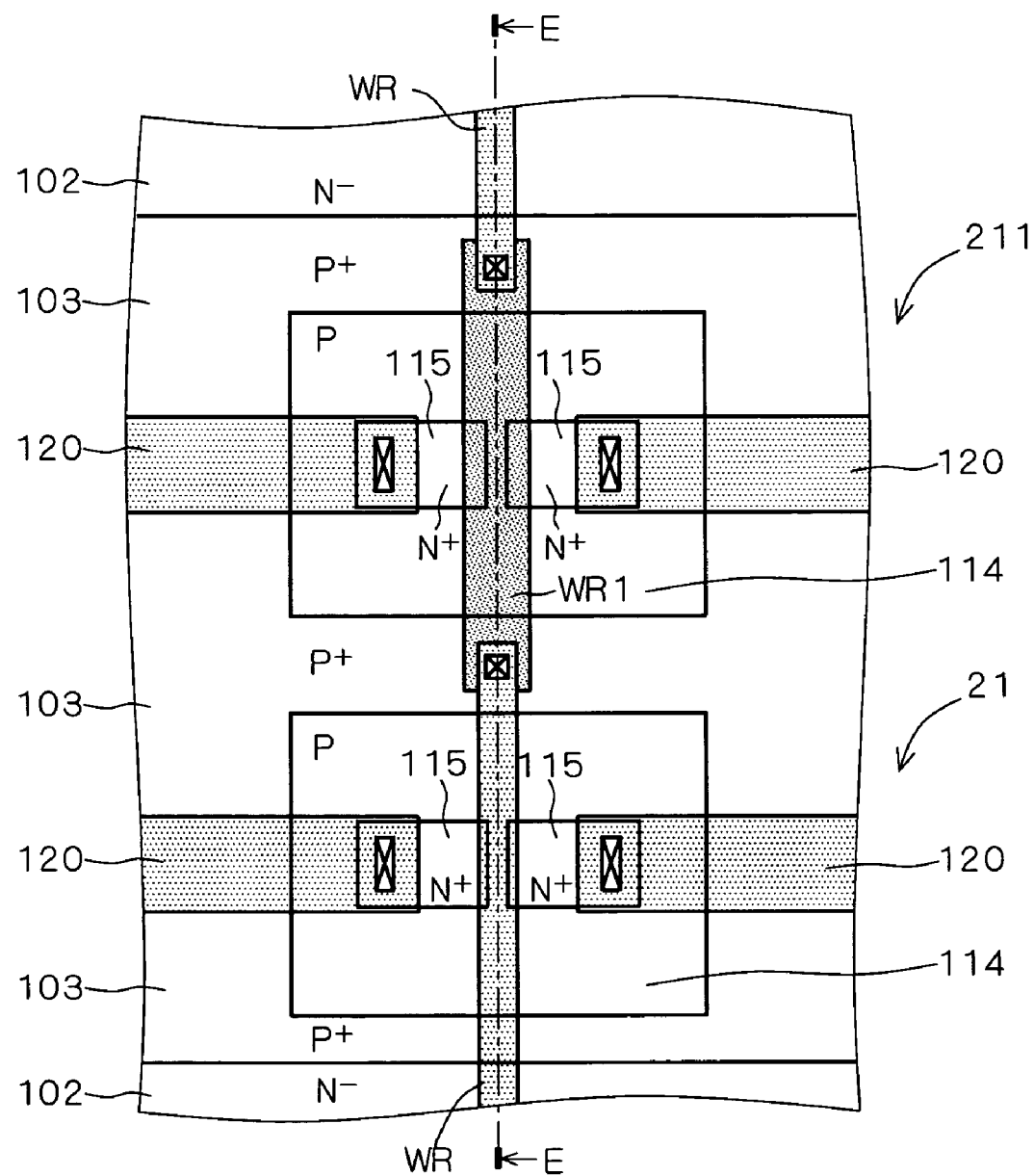
FIG. 15 is a plan view illustrating the structure of a voltage detector of the fourth modification of the HVIC according to the first preferred embodiment.

FIG. 15 is a plan view illustrating the plane structure of the NMOS transistors 21 and 211, and for ease of description, also illustrates an impurity region formed in the surface of the epitaxial layer 102. FIG. 16 illustrates the sectional structure of the NMOS transistors 21 and 211 shown in FIG. 15 taken along the line E-E.

As shown in FIG. 15, in the NMOS transistor 21, the P-type diffusion regions 115 as source/drain regions are selectively provided in the surface of the P-well region 114 on the both sides of the high side interconnect line WR. Then, the source/drain electrodes 120 of, e.g., aluminum are formed over the N-type diffusion regions 115 and are electrically connected to the N-type diffusion regions 115. One of the source/drain electrodes 120 is grounded.

On the other hand, in the NMOS transistor 211, in a layer below the high side interconnect line WR, a high side interconnect line WR1 made of, e.g., polysilicon is provided as a gate electrode, and the P-type diffusion regions 115 are selectively provided as source/drain electrodes in the surface of the P-well region 114 on the both sides of the high side interconnect line WR1.

The high side interconnect lines WR and WR1 formed in different depths are made of different materials in view of using interconnect materials used in the respective layers, which can advantageously prevent increase in manufacturing costs.

Then, the source/drain electrodes 120 of, e.g., aluminum are formed over the N-type diffusion regions 115 and are electrically connected to the N-type diffusion regions 115. One of the source/drain electrodes 120 is grounded.

The high side interconnect lines WR and WR1 are electrically connected through contact holes or the like and are applied with the same potential V1 (FIG. 14).

Figure 16:
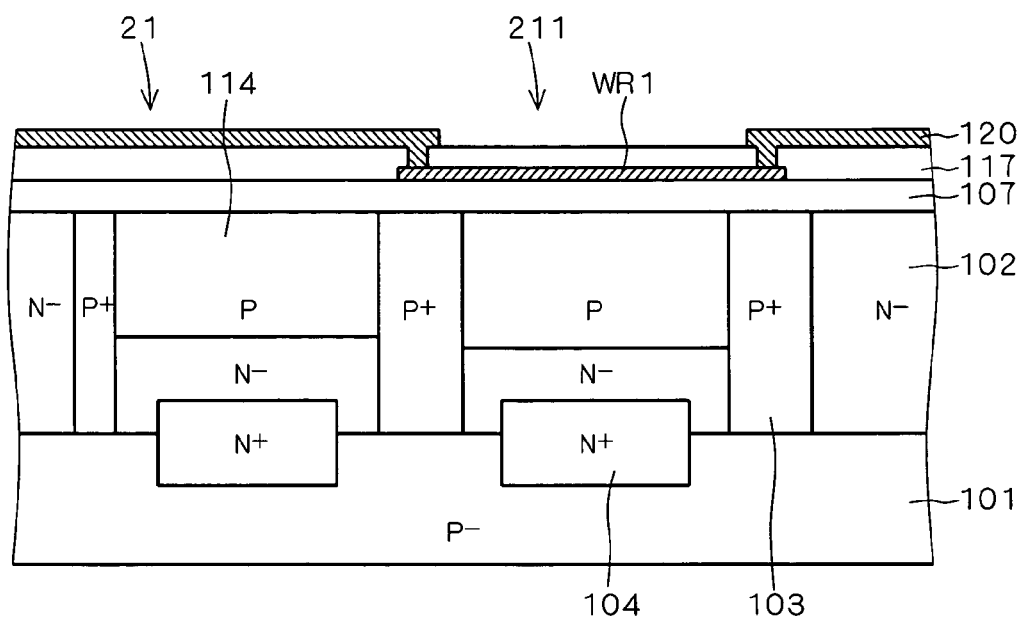
FIG. 16 is a sectional view illustrating the structure of the voltage detector of the fourth modification of the HVIC according to the first preferred embodiment.

Specifically, as shown in FIG. 16, in the NMOS transistor 21, the high side interconnect line WR provided over the field oxide film 107 and interlayer insulating film 117 is used as a gate electrode, and the field oxide film 107 and interlayer insulating film 117 are used as a gate oxide film. On the other hand, in the NMOS transistor 211, the high side interconnect line WR1 provided over the field oxide film 107 is used as a gate electrode, and the field oxide film 107 is used as a gate oxide film. Accordingly, the NMOS transistors 21 and 211 have gate oxide films of different thicknesses from each other, so that a plurality of detection levels of the potential VS can be set.

That is, the NMOS transistors 21 and 211 have different threshold voltages Vth according to the following equation (1) when the respective P-well regions 114 have the same surface concentration, and thus, an NMOS transistor using a high side interconnect line WR with a thicker gate oxide film has a higher threshold voltage Vth.

$$Vth = \frac{\sqrt{2\varepsilon s q N A(2\phi B)}}{Co} + 2\phi B \qquad (1)$$

That is, a capacitance Co of a gate oxide film per unit area is expressed as Co=εox/d. Here, εox is a dielectric constant of an oxide film, q is the quantity of charges of electron, and d is a film thickness of a gate oxide film. As the film thickness of the gate oxide film increases, the capacitance Co decreases and the threshold voltage Vth increases.

In the above equation (1), εs is a dielectric constant of semiconductor, NA is an impurity concentration of the P-well region 114, and φB is Fermi potential.

MOS transistors are turned on/off prior and after the preset threshold voltage Vth, and thus can only detect a potential higher or lower than a certain potential. However, the use of MOS transistors having different threshold voltages Vth as voltage detectors as in the HVIC 100C enables setting a plurality of detection levels of the potential VS.

Now, referring to FIG. 17, voltage detection in the HVIC 100C will be described.

Figure 17:
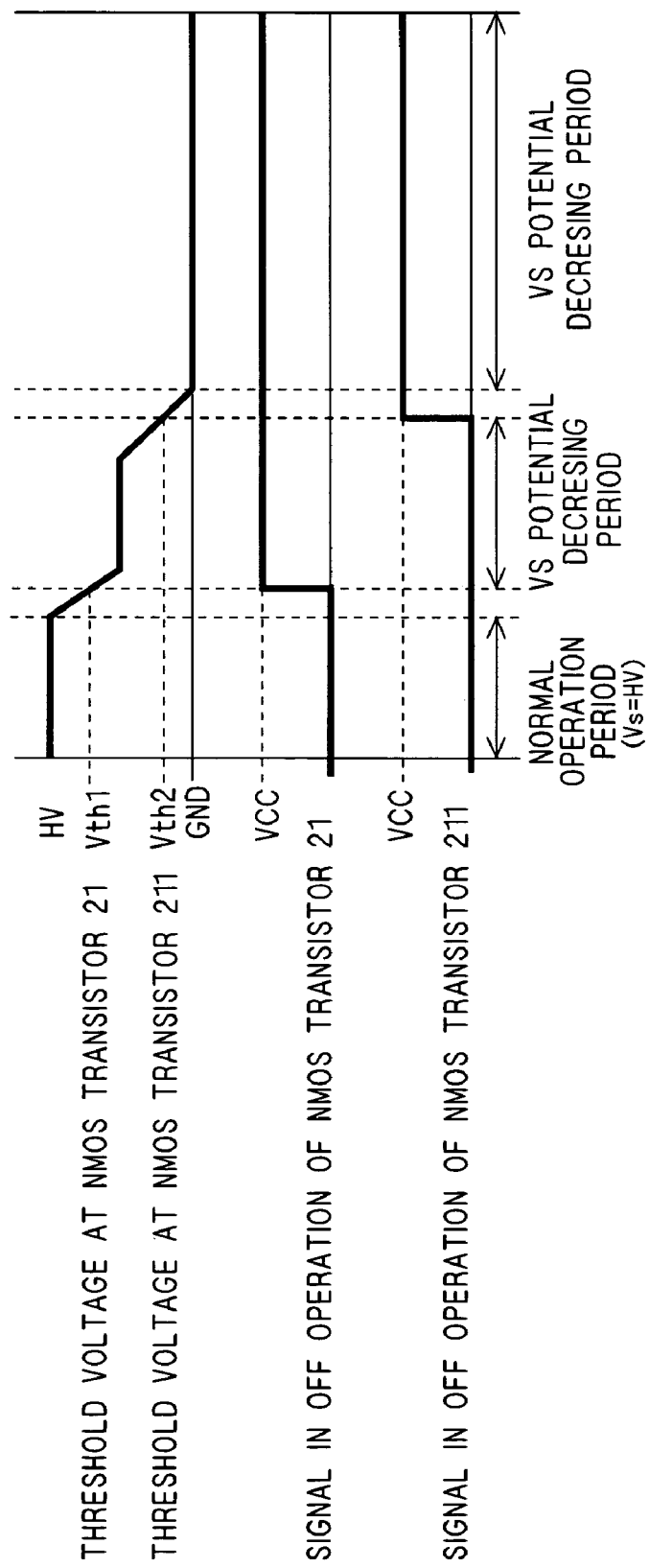
FIG. 17 is a graph explaining the operation of the voltage detector of the fourth modification of the HVIC according to the first preferred embodiment.

FIG. 17 shows fluctuation characteristics of the potential VS and output waveforms of the drain potential V2 when the NMOS transistors 21 and 211 operate in response to fluctuations in the potential VS.

As shown in FIG. 17, in the case where the potential VS varies gradually from the high potential HV to the ground potential GND, the NMOS transistor 21 is first brought into an off state and the drain potential V2 is changed to the logic circuit voltage VCC at the time when the potential V2 reaches a threshold voltage Vth1 of the NMOS transistor 21.

Further, at the time when the potential VS reaches a threshold voltage Vth2 of the NMOS transistor 211, the NMOS transistor 211 is brought into an off state, and the drain voltage V2 is changed to the logic circuit voltage VCC.

As described, detection levels of the potential VS in the HVIC 100C can be set at three. Even when the potential VS varies gradually, voltage detection can be performed by finding the logical sum or logical product of output values of the NMOS transistors 21 and 211.

Figure 18:
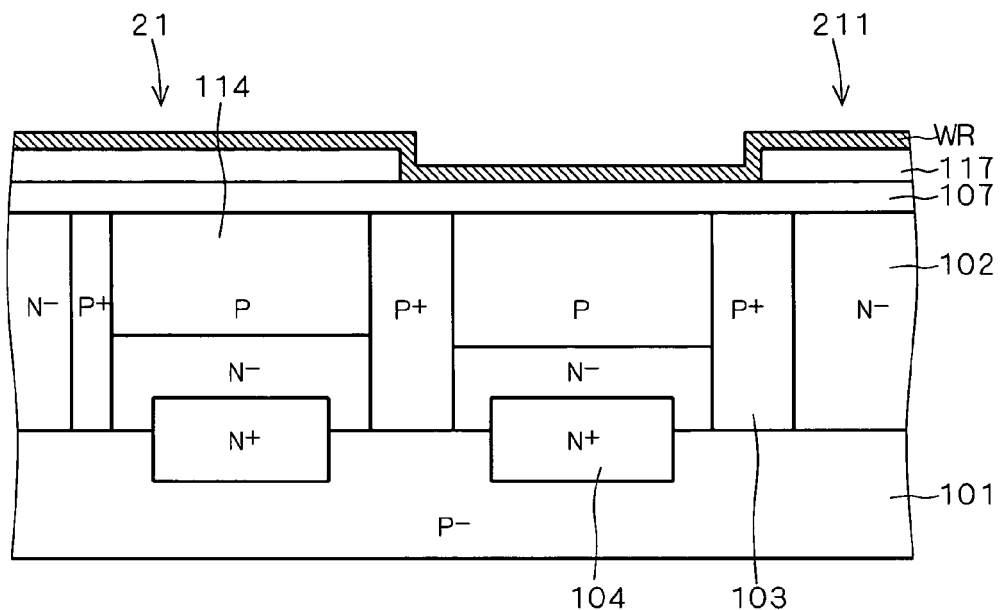
FIGS. 18 and 19 are sectional views illustrating the structure of the voltage detector of the fourth modification of the HVIC according to the first preferred embodiment.
Figure 19:
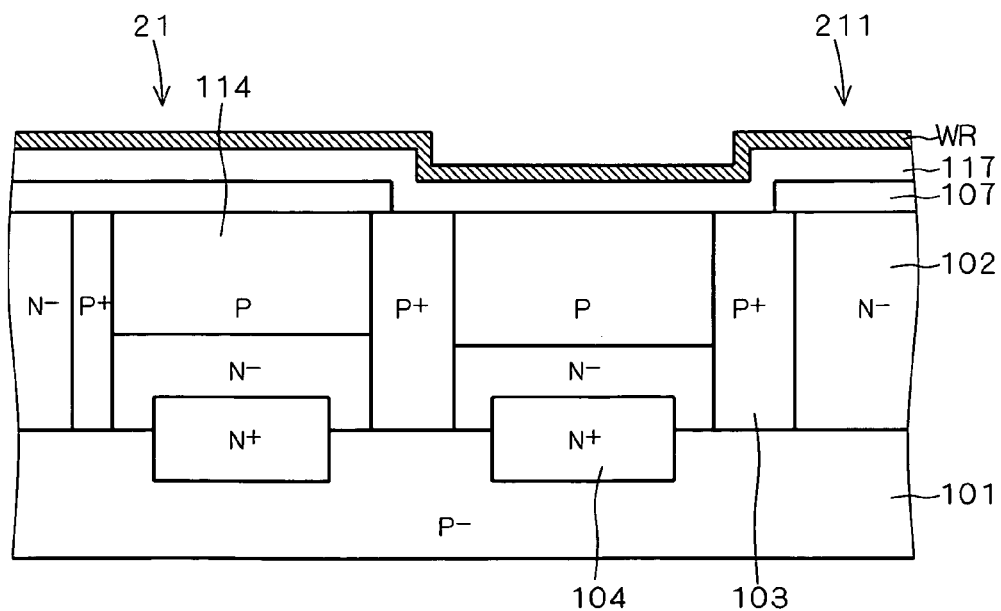

In the case where the NMOS transistors 21 and 211 have gate oxide films of different thicknesses, the structures shown in FIGS. 18 and 19 may be employed.

That is, in FIG. 18, part of the interlayer insulating film 117 corresponding to the position at which the gate electrode of the NMOS transistor 211 is to be provided is selectively removed by anisotropic etching or the like to expose the field oxide film 107. Thereafter, the high side interconnect line WR is integrally provided as the gate electrodes of the NMOS transistors 21 and 211. The NMOS transistor 21 using the field oxide film 107 and interlayer insulating film 117 as a gate oxide film and the NMOS transistor 211 using the field oxide film 107 as a gate oxide film are thereby obtained.

In FIG. 19, part of the field oxide film 107 corresponding to the position at which the gate electrode of the NMOS transistor 211 is to be provided is selectively removed by anisotropic etching or the like prior to forming the interlayer insulating film 117 to expose active regions of the P-well region 114 and the like. Thereafter, the interlayer insulating film 117 is formed to entirely cover the main surface of the epitaxial layer 102 including the active regions as exposed, following which the high side interconnect line WR is integrally provided as the gate electrodes of the NMOS transistors 21 and 211. The NMOS transistor 21 using the field oxide film 107 and interlayer insulating film 117 as a gate oxide film and the NMOS transistor 211 using the interlayer insulating film 117 as a gate oxide film are thereby obtained.

The structures of the NMOS transistor 211 shown in FIGS. 16 and 18 correspond to the structure in which only the field oxide film 107 is used as a gate oxide film described in the first preferred embodiment, and the structure of the NMOS transistor 211 shown in FIG. 19 corresponds to that in which only the interlayer insulating film 117 is used as a gate oxide film.

As described, providing the high side interconnect line WR integrally in the NMOS transistors 21 and 211 eliminates the need for connection between interconnect lines, which can simplify manufacturing steps.

Although the use of the two MOS transistors, i.e., the NMOS transistors 21 and 211 has been described above by way of example, the number of MOS transistors is not limited to two. By changing the thickness of respective gate oxide films of a plurality of MOS transistors, the number of detection levels of the potential VS can further be increased.

7-2. Change in Impurity Concentration in Well Region

To cause the NMOS transistors 21 and 211 to have different threshold voltages, a structure in which the respective NMOS transistors have the P-well regions 114 with different impurity concentrations may be employed as well as the structure in which the respective NMOS transistors have the gate oxide film of different thicknesses.

That is, as expressed by the equation (1), the threshold voltage Vth can be controlled by the impurity concentration NA of the P-well region 114. Therefore, the impurity concentration near the surface of the P-well region 114 in the NMOS transistor 21 is adjusted so as to be higher than that in the NMOS transistor 211 in the manufacturing process (channel doping step) of the P-well regions 114 in each of the NMOS transistors 21 and 211, so that the NMOS transistors 21 and 211 have different impurity concentrations in so-called channel regions, and therefore have different threshold voltages from each other.

For instance, boron ions (P-type impurities) of the same concentration are implanted into the respective P-well regions 114 in the NMOS transistors 21 and 211, and phosphor ions (N-type impurities) are thereafter implanted only into the P-well region 114 of the NMOS transistor 211, so that the P-type impurity concentration at the surface can be reduced. This allows the threshold voltage Vth of the NMOS transistor 211 to be reduced.

As described, adjusting the impurity concentration to control the threshold voltage allows the threshold voltage to vary in a wide range with high accuracy. This provides an advantage in that a plurality of detection levels of the potential VS can be set in the case where the potential VS fluctuates.

8. Fifth Modification

In the sectional structure of the NMOS transistor 21 described referring to FIG. 7, the area of the buried diffusion region 104 is smaller than that of the P-well region 114 and the P-type diffusion region 103 surrounding the P-well region 114 reaches the surface of the semiconductor substrate 101, which means the P-well region 114 is not electrically isolated from the semiconductor substrate 101. This structure is for fixing the potential of the P-well region 114 to that of the semiconductor substrate 101.

However, electrically isolating the P-well region 114 from the semiconductor substrate 101 allows the threshold voltage of the NMOS transistor 21 to electrically vary.

Now, referring to FIGS. 20 and 21, an exemplary structure in which the threshold voltage of the NMOS transistor 21 electrically varies will be described.

Figure 20:
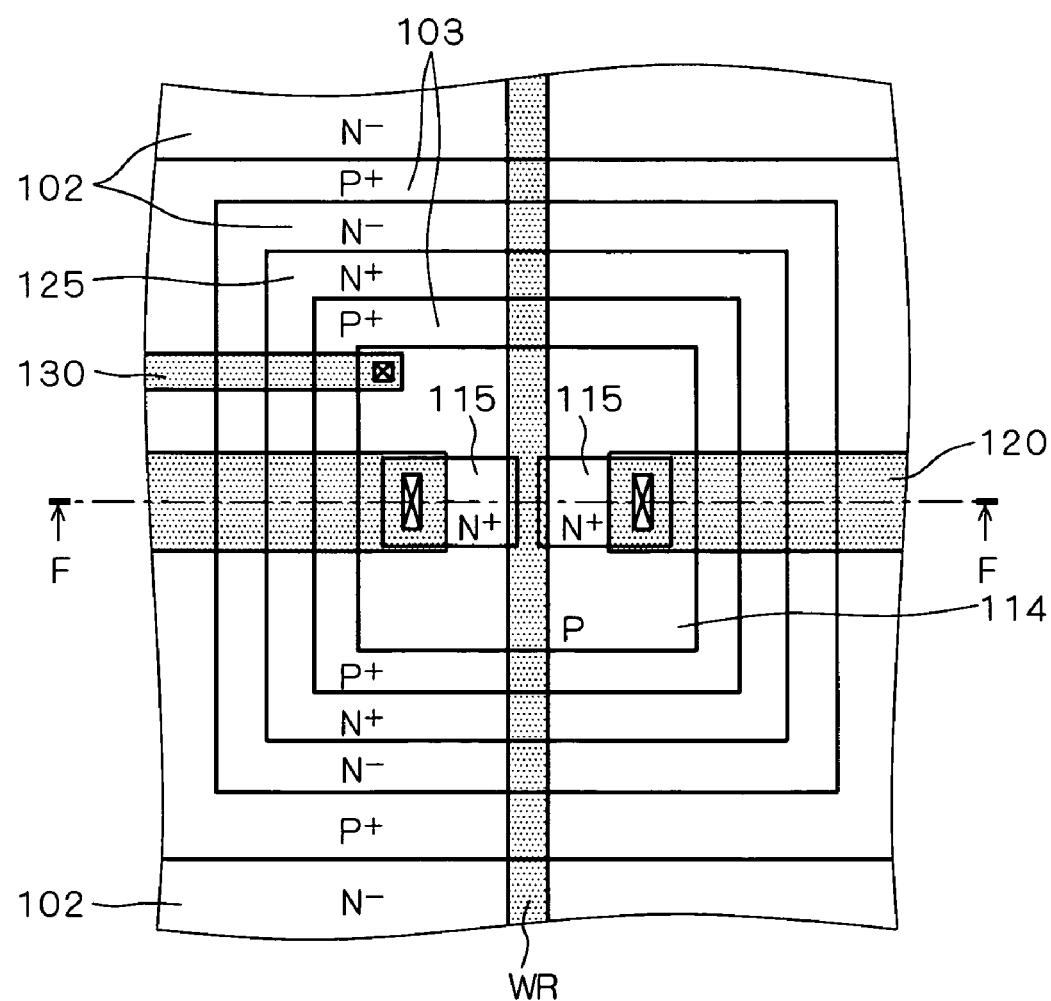
FIG. 20 is a plan view illustrating a voltage detector of a fifth modification of the HVIC according to the first preferred embodiment.

FIG. 20 is a plan view illustrating the plane structure of the NMOS transistor 21, and for ease of description, also illustrates impurity regions formed in the surface of the epitaxial layer 102. FIG. 21 illustrates the sectional structure of the NMOS transistor 21 shown in FIG. 20 taken along the line F—F. Components shown in FIGS. 20 and 21 similar to those in the NMOS transistor 21 shown in FIG. 7 are indicated by the same reference numerals, repeated explanation of which is thus omitted here.

As shown in FIG. 20, the NMOS transistor 21 is provided on the P-well region 114 formed in the surface of the epitaxial layer 102. The N-type diffusion regions 115 are selectively formed as source/drain regions in the surface of the P-well region 114 on the both sides of the high side interconnect line WR. The P-well region 114 is surrounded by the P-type diffusion region 103, and the P-type diffusion region 103 is surrounded by the N-type diffusion region 125. The N-type diffusion region 125 is surrounded by the epitaxial layer 102, and the epitaxial layer 102 is surrounded by the P-type diffusion region 103.

Then, the source/drain electrodes 120 of, e.g., aluminum are formed over the N-type diffusion regions 115 and are electrically connected to the N-type diffusion regions 115. One of the source/drain electrodes 120 is grounded.

A potential control electrode 130 of, e.g., aluminum is formed over the P-well region 114 and is electrically connected to the P-well region 114.

Figure 21:
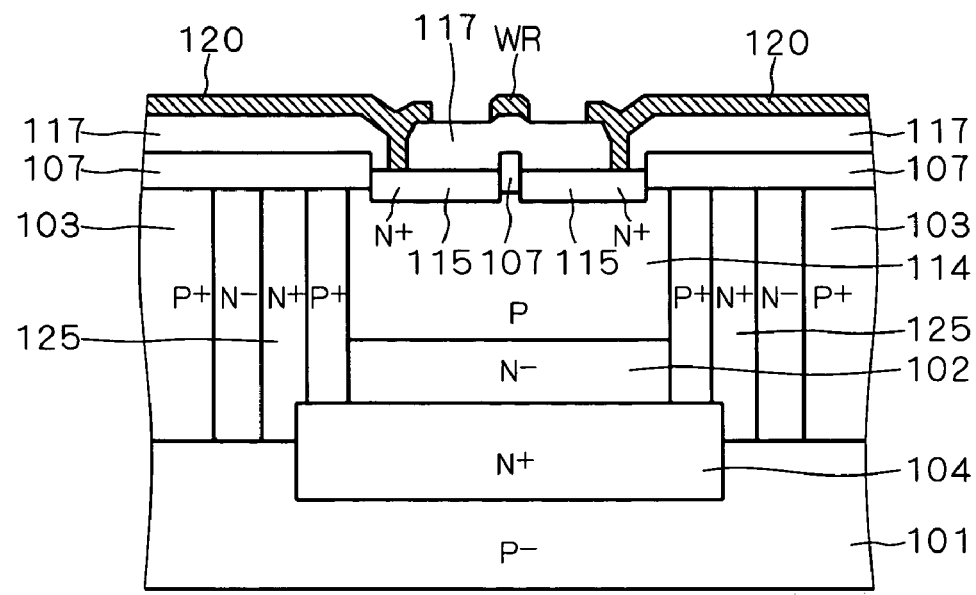
FIG. 21 is a sectional view illustrating the voltage detector of the fifth modification of the HVIC according to the first preferred embodiment.

Further, as shown in FIG. 21, the buried diffusion region 104 is formed to be larger in area than the P-well region 114, and the P-type diffusion region 103 is provided to reach the surface of the buried diffusion region 104. The N-type diffusion region 125, epitaxial layer 102 and the outermost part of the P-type diffusion region 103 are all provided to reach the surface of the semiconductor substrate 101, and the P-well region 114 is electrically isolated from the semiconductor substrate 101 completely.

With such structure, applying a bias voltage to the P-well region 114 through the potential control electrode 130 enables arbitrary control of potential at the P-well region 114, which allows the threshold voltage to electrically vary.

The relation between a bias voltage VBS applied to the P-well region 114 and variation range of the threshold voltage ΔVth is expressed by the following equation (2).

$$\Delta Vth = \frac{\sqrt{2\varepsilon sqNA}}{Co} \cdot \left(\sqrt{2\phi B + VBS} - \sqrt{2\phi B}\right) \quad (2)$$

Figure 22:
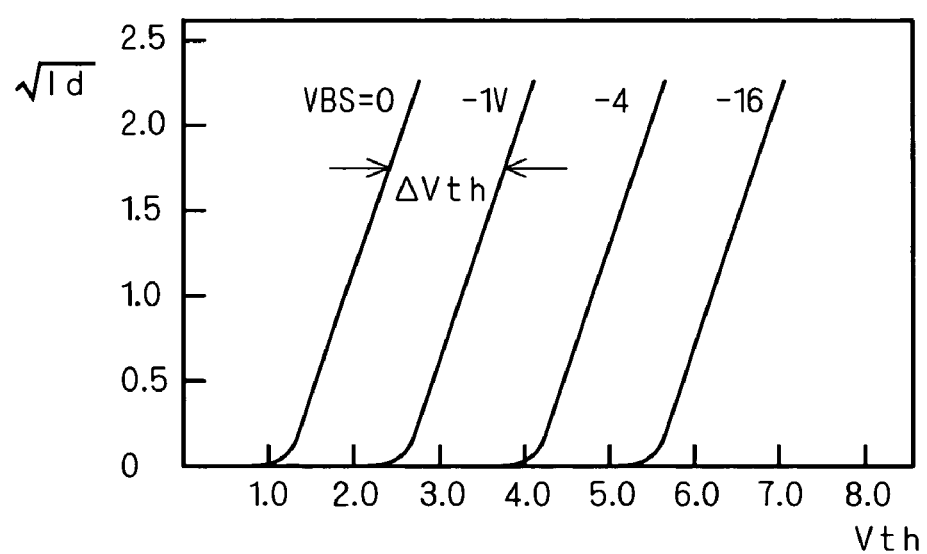
FIG. 22 is a graph explaining the operation of the voltage detector of the fifth modification of the HVIC according to the first preferred embodiment.

FIG. 22 shows the relationship between the threshold voltage Vth and the square root of drain current Id in the case where the bias voltage VBS to be applied to the P-well region 114 varies.

According to a theoretical equation for a MOS transistor, drain current in a saturation current region increases in proportion to the square of a gate voltage. Thus, plotting the square root of drain current Id at the time when the gate voltage is changed with the bias voltage VBS being fixed to a predetermined value and a drain voltage in the saturation current region being applied, one of characteristics shown in FIG. 22 can be obtained. Since a value of gate voltage that satisfies $\sqrt{Id}=0$ is defined as the threshold voltage Vth, the horizontal axis is indicated as the threshold voltage Vth in FIG. 22.

FIG. 22 shows the characteristics in the case of setting the bias voltage VBS at 0V, −1V, −4V and −16V, and it is apparent that the threshold voltage Vth can be controlled by adjusting the bias voltage VBS.

Therefore, employing the structure shown in FIGS. 20 and 21 for the NMOS transistor 21, changing the bias voltage VBS to be applied to the P-well region 114, and monitoring the bias voltage VBS at which the NMOS transistor 21 is turned off, a detection level suitable for the potential VS can be set.

The operation of obtaining the bias voltage VBS at which the NMOS transistor 21 is turned off is actually performed when conducting an electrical characteristic test of a wafer after completion of manufacturing steps of HVIC 100 on the wafer. A voltage that corresponds to the potential VS is applied to the node N1 from outside (FIG. 1), and at that time, the bias voltage VBS at which the NMOS transistor 21 is turned off is measured.

Figure 23:
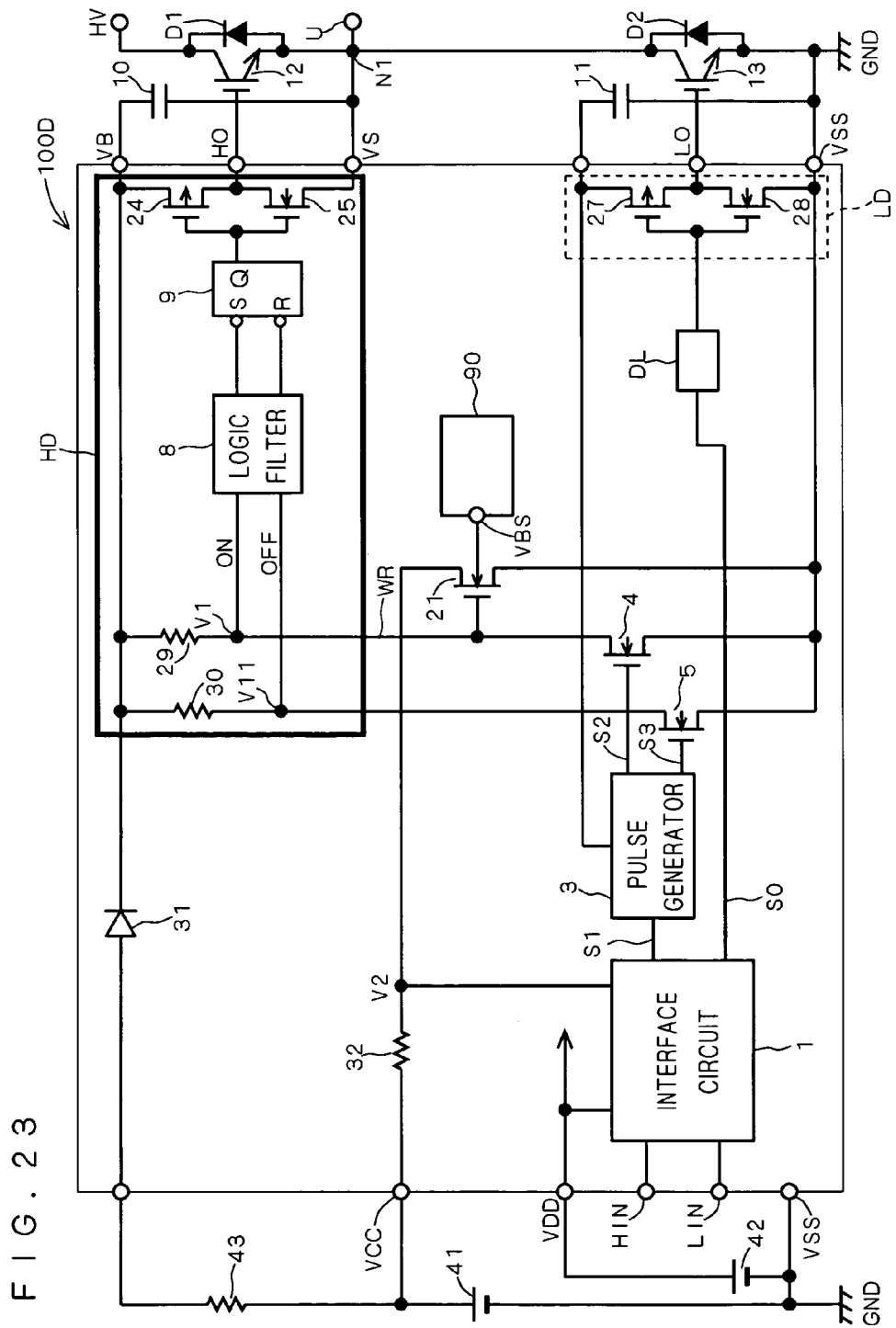
FIG. 23 is an explanatory view illustrating the circuit configuration of the fifth modification of the HVIC according to the first preferred embodiment.

A bias voltage output circuit 90 is incorporated as in an HVIC 100D shown in FIG. 23, for example, such that the bias voltage VBS is always applied to the P-well region 114 during the operation of the HVIC.

Figure 24:
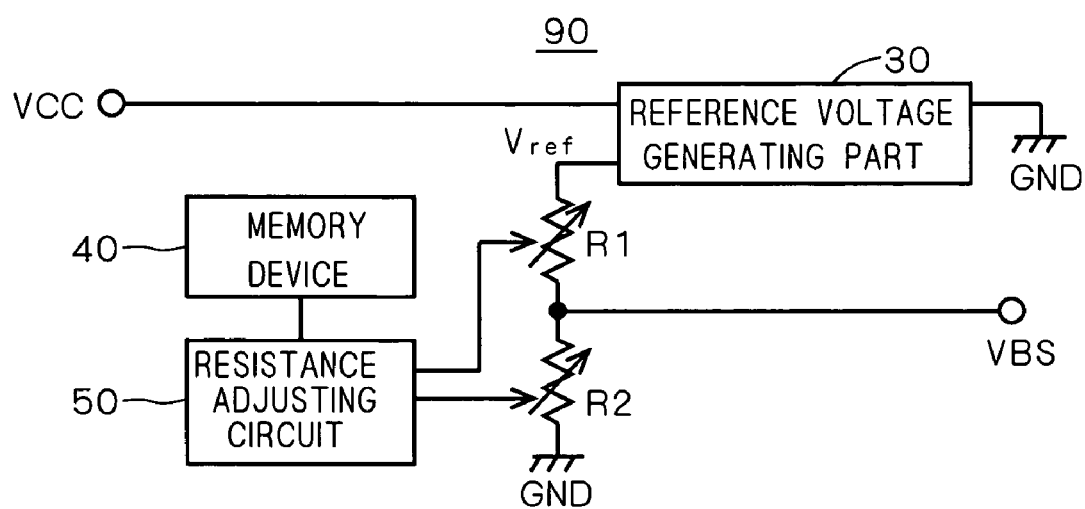
FIG. 24 is an explanatory view illustrating the configuration of a bias voltage output circuit.

An exemplary structure of the bias voltage output circuit 90 is shown in FIG. 24.

As shown in FIG. 24, the bias voltage output circuit 90 includes a reference voltage generating part 30 for generating a reference voltage Vref using the logic circuit voltage VCC as a power supply, variable resistors R1 and R2 for generating the bias voltage VBS by resistive dividing the reference voltage Vref, a resistance adjusting circuit 50 for adjusting resistance values of the variable resistors R1 and R2, and a memory device 40 such as EPROM in which a control program for the resistance adjusting circuit 50 is stored.

In order to adjust the bias voltage VBS, a program for controlling the resistance adjusting circuit 50 based on the relationship between the resistance values of the variable resistors R1 and R2 and bias voltage VBS is stored in the memory device 40. For instance, when the memory device 40 receives information that the HVIC 100D starts operating, the control program is automatically supplied to the resistance adjusting circuit 50.

As described, providing the bias voltage output circuit 90 for adjusting the bias voltage VBS enables adjustment of variations in characteristics of the threshold voltage due to manufacturing variations of a voltage detector, and eliminates the need to prepare a plurality of voltage detectors to provide redundancy, which can advantageously reduce the device area.

Further, the threshold voltage of the voltage detector can easily be set without changing manufacturing conditions.

Furthermore, a plurality of MOS transistors of the same structure can be set to have different threshold voltages from each other. Therefore, such MOS transistors of the same structure allow a plurality of detection levels of the potential VS to be set as described referring to FIG. 15.

Second Preferred Embodiment

1. Device Structure and Operation

Figure 25:
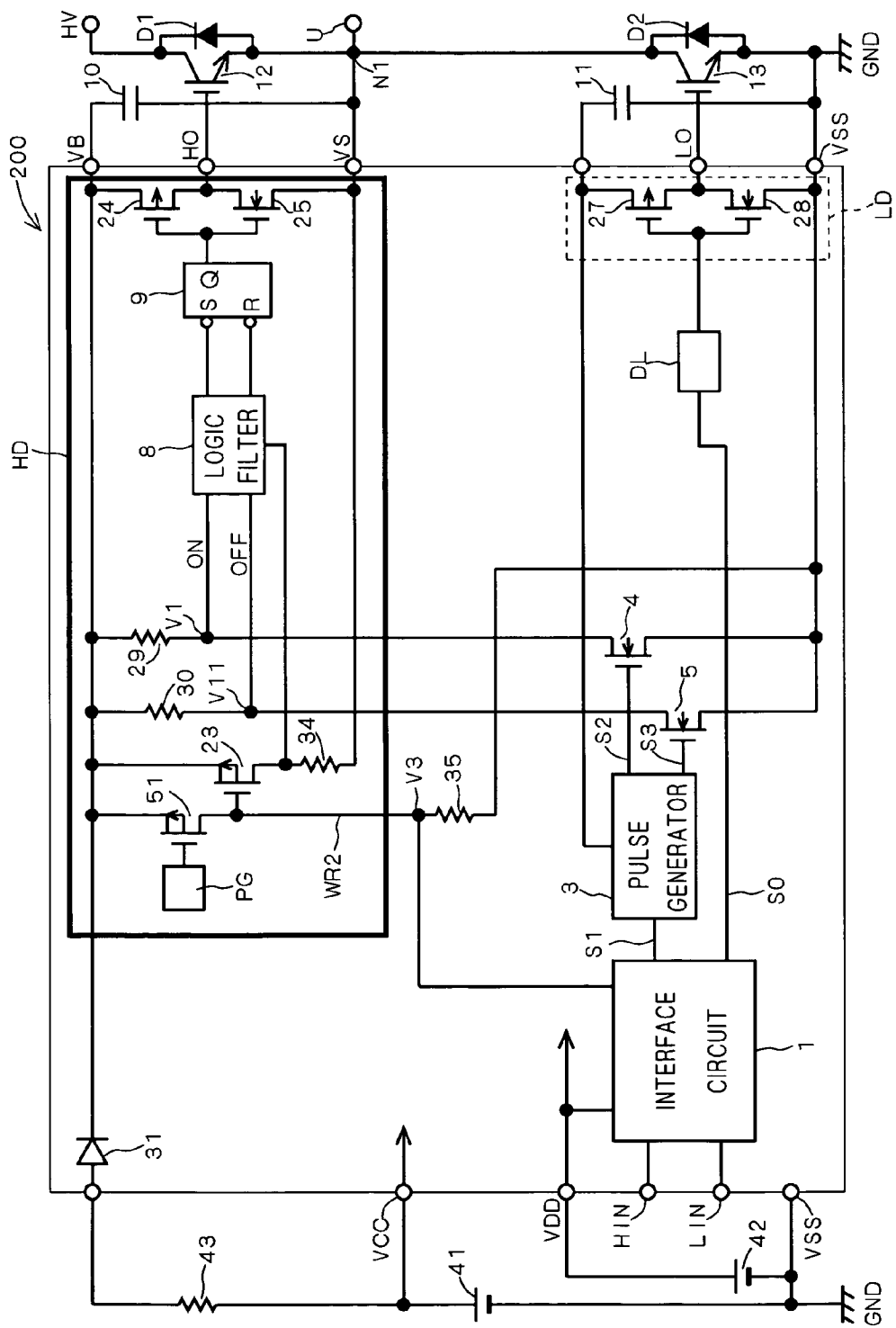
FIG. 25 is an explanatory view illustrating the circuit configuration of an HVIC according to a second preferred embodiment of the invention.

FIG. 25 illustrates the configuration of an HVIC 200 as a second preferred embodiment of the present invention. Components shown in FIG. 25 similar to those in the HVIC 100 in FIG. 1 are indicated by the same reference numerals, repeated explanation of which is thus omitted here.

Although the HVIC 100 described referring to FIG. 1 has the structure in which the voltage detector is provided in the low side region, the HVIC 200 shown in FIG. 25 is configured in such a manner that a voltage detector is provided in a high side power device driving circuit HD, and detection results are given to the logic filter 8, so that the output (control signal) HO of the high side gate driver is stopped in the case where the potential VS becomes a ground potential due to ground-fault.

In FIG. 25, a PMOS transistor 23 serving as a voltage detector has its gate electrode connected to the drain electrode of an HPMOS transistor 51 provided in the high side power device driving circuit HD for reversely level-shifting a signal from the driving circuit HD to the low side, and its drain electrode connected to the node N1 through a resistor 34. The PMOS transistor 23 has its source electrode connected to the source electrode of the PMOS transistor 24, i.e., one of the electrodes of the capacitor 10.

The HPMOS transistor 51 has its source electrode connected to the source electrode of the PMOS transistor 24, i.e., the one of the electrodes of the capacitor 10, and its drain electrode grounded through a resistor 35 provided on the low side. Therefore, when the HPMOS transistor 51 is brought into an on state, drain current is supplied to the low side through a low side interconnect line (output line) WR2. The resistor 35 is connected to this low side interconnect line WR2 such that a potential V3 is generated. Supplying this potential V3 to the interface circuit 1 means a signal from the driving circuit HD is reversely level-shifted to the low side. The gate electrode of the HPMOS transistor 51 receives a pulse signal from a pulse generator PG, and sends a signal to the low side in response to the pulse signal.

Although providing a high voltage transistor such as the HPMOS transistor 51 in the high side for use as a reverse level shift transistor has conventionally been performed, the inventor paid attention to the fact that the potential V3 at the HPMOS transistor 51 can be considered substantially equal to the potential VS, and he has reached a technical idea of detecting the potential VS by monitoring the potential V3.

More specifically, since the low side interconnect line WR2 is connected to the low side circuit as described above, its potential is basically close to the ground potential GND. Therefore, in the case where the potential VS at the node N1 in the high side power device driving circuit HD becomes the ground potential, for example, due to ground-fault, the PMOS transistor 23 is brought into an off state, and the drain potential V3 becomes equal to the potential VS at that time, i.e., GND, so that an output of the PMOS transistor 23 becomes "LOW".

On the other hand, when the potential VS at the node N1 becomes the high potential HV, the PMOS transistor 23 is brought into an on state, and the drain potential V3 becomes equal to the potential VS at that time, i.e., GND, so that an output of the PMOS transistor 23 becomes "HIGH".

As described, providing the PMOS transistor 23 allows the potential VS to be monitored within the high side power device driving circuit HD.

2. Exemplary Configuration

Next, an exemplary configuration of the HVIC 200 will be described referring to FIGS. 26 and 27.

Figure 26:
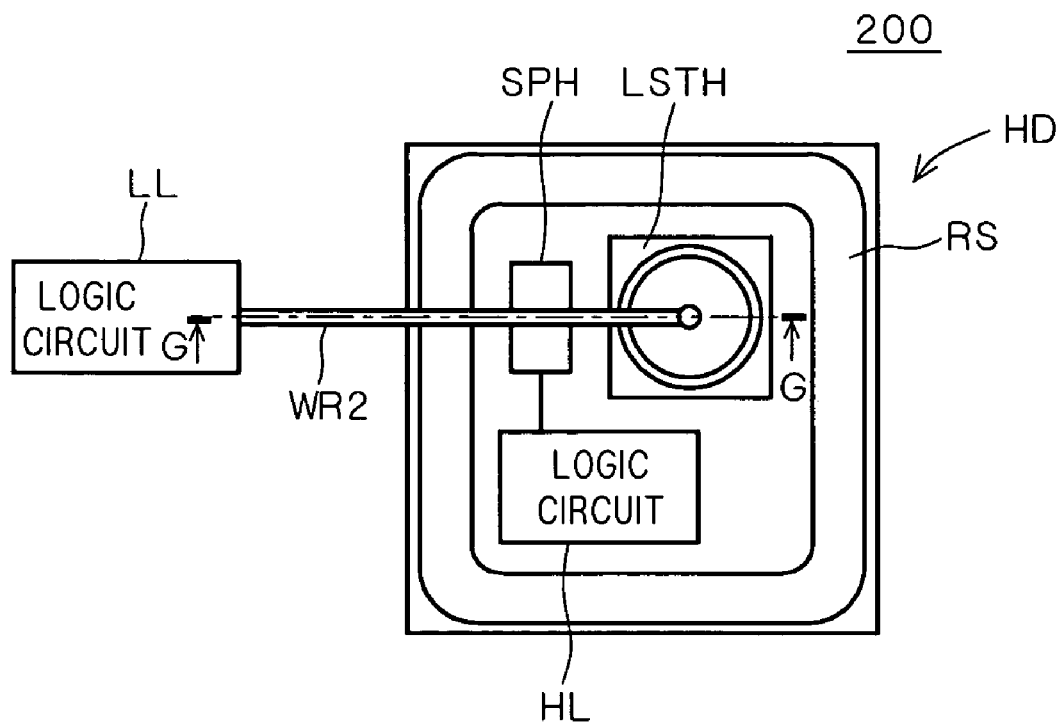
FIG. 26 is a plan view illustrating the structure of the HVIC according to the second preferred embodiment.

FIG. 26 is a plan view of the plane configuration of the HVIC 200 on a main surface of a semiconductor substrate illustrating the high side power device driving circuit HD, a voltage sensor part SPH in which a voltage detector such as the PMOS transistor 23 is provided, a high voltage level shift transistor LSTH such as the HPMOS transistor 51, a high side logic circuit HL such as the logic filter 8 and a low side logic circuit LL. FIG. 26 is a schematic view, and the size of respective components and the spacing with which they are arranged differ in a real device. Components similar to those in the HVIC 100 in FIG. 4 are indicated by the same reference numerals, repeated explanation of which is thus omitted here.

As shown in FIG. 26, the voltage sensor part SPH is arranged such that the low side interconnect line WR2 extending out of the level shift transistor LSTH in the high side power device driving circuit HD to reach the low side logic circuit LL extends over the voltage sensor part SPH. The low side interconnect line WR2 serves as a gate electrode, and source/drain layers are provided on its both sides. A MOS transistor as a voltage detector is thereby formed.

Figure 27:
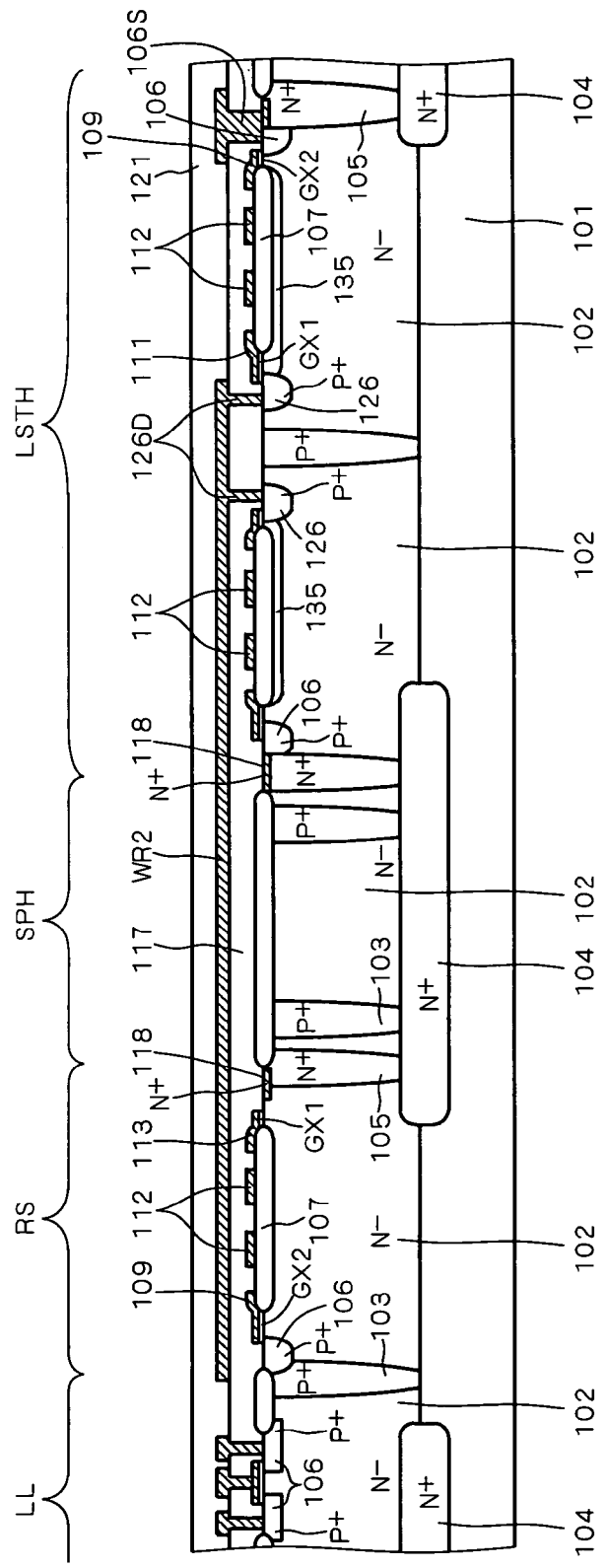
FIG. 27 is a sectional view illustrating the structure of the HVIC according to the second preferred embodiment.

FIG. 27 illustrates an example of the sectional structure taken along the line G—G of FIG. 26. Components similar to those in the HVIC 100 in FIG. 5 are indicated by the same reference numerals, repeated explanation of which is thus omitted here.

FIG. 27 shows the sectional structure of the level shift transistor LSTH, voltage sensor part SPH, part of the isolation structure RS surrounding the high side power device driving circuit HD, and low side logic circuit LL. First, the structure of the level shift transistor LSTH will be described.

The level shift transistor LSTH employs the multi-field plate structure for field relieving similarly to the isolation structure RS. That is, a P-type diffusion region 126 ($P^+$) formed annularly in the surface of the epitaxial layer 102 serves as a drain region, and the field oxide film 107 is provided to concentrically surround the P-type diffusion region 126 at an interval. Then, the P-type diffusion region 106 to be a source region is concentrically provided in the surface of the epitaxial layer 102 on the periphery of the concentrically provided field oxide film 107, and the N-type diffusion region 118 ($N^+$) is concentrically provided so as to be in contact with the outer edge of the P-type diffusion region 106. A P-type diffusion region 135 is provided to extend over from the outer peripheral edge of the P-type diffusion region 126 to cover the whole area of the bottom of the field oxide film 107.

Then, a low side polysilicon field plate 111 is provided to extend over from an inner edge of the field oxide film 107 to an edge of the N-type diffusion region 126. The plurality of floating potential polysilicon field plates 112 are concentrically provided on the field oxide film 107. The gate electrode 109 is concentrically provided to extend over from an outer edge of the field oxide film 107 to an edge of the P-type diffusion region 106.

The low side polysilicon field plate 111 and gate electrode 109 are provided on the gate oxide films GX1 and GX2, respectively.

The N-type diffusion region 118 partly overlaps the N-type diffusion region 105 extending from the main surface of the epitaxial layer 102 to reach the buried diffusion region 104.

The voltage sensor part SPH includes the field oxide film 107 selectively formed in the surface of the epitaxial layer 102 and the P-type diffusion region 103 (P+) extending from the main surface of the epitaxial layer 102 to reach the buried diffusion region 104 (N+) for defining an active region of a MOS transistor.

The buried diffusion region 104 is provided so as to correspond to the region in which the voltage sensor part SPH is provided.

The isolation structure RS includes the field oxide film 107 provided on the surface of the epitaxial layer 102 to surround the high side power device driving circuit HD, the P-type diffusion region 106 (P+) provided in the surface of the epitaxial layer 102 at an interval from the field oxide film 107, the N-type diffusion region 118 provided in the surface of the epitaxial layer 102 on the opposite side of the P-type diffusion region 106 with respect to the field oxide film 107, the low side polysilicon field plate 111 provided to extend over from an edge of the field oxide film 107 to an edge of the P-type diffusion region 106, the plurality of floating potential polysilicon field plates 112 selectively provided on the field oxide film 107, and the high side polysilicon field plate 113 provided to extend over from an edge of the field oxide film 107 to an edge of the N-type diffusion region 118.

The field oxide film 107 is provided on the surface of the epitaxial layer 102 between the level shift transistor LSTH and low side logic circuit LL, and the P-type diffusion region 103 is provided to extend from the main surface of the epitaxial layer 102 covered with the field oxide film 107 to reach the surface of the semiconductor substrate 101.

Then, the interlayer insulating film 117 is provided to entirely cover the main surface of the epitaxial layer 102.

In the level shift transistor LSTH, a drain electrode 126D is provided to extend through the interlayer insulating film 117 to reach the P-type diffusion region (drain region) 126, and a source electrode 106S is provided to extend through the interlayer insulating film 117 to reach the P-type diffusion region (source region) 106.

Provided on the interlayer insulating film 117 is the low side interconnect line WR2 extending over the voltage sensor part SPH and isolation structure RS with one end connected to the drain electrode 126D and the other end extending into the low side logic circuit LL. The low side interconnect line WR2 is made of a conductor such as aluminum.

Further, the passivation film (glass coat film) 121 is provided to cover the low side interconnect line WR2 and interlayer insulating film 117.

3. Characteristic Effects

As described above, the HVIC 200 allows the potential VS to be monitored within the high side power device driving circuit HD. Therefore, in the case where the potential VS is detected to be abnormal, such information is given to the high side logic circuit HL such as the logic filter 8, so that an OFF signal can be outputted immediately. This can reduce a time period between detection of the potential VS and stop of the high side power device.

Third Preferred Embodiment

1. Device Structure and Operation

Figure 28:
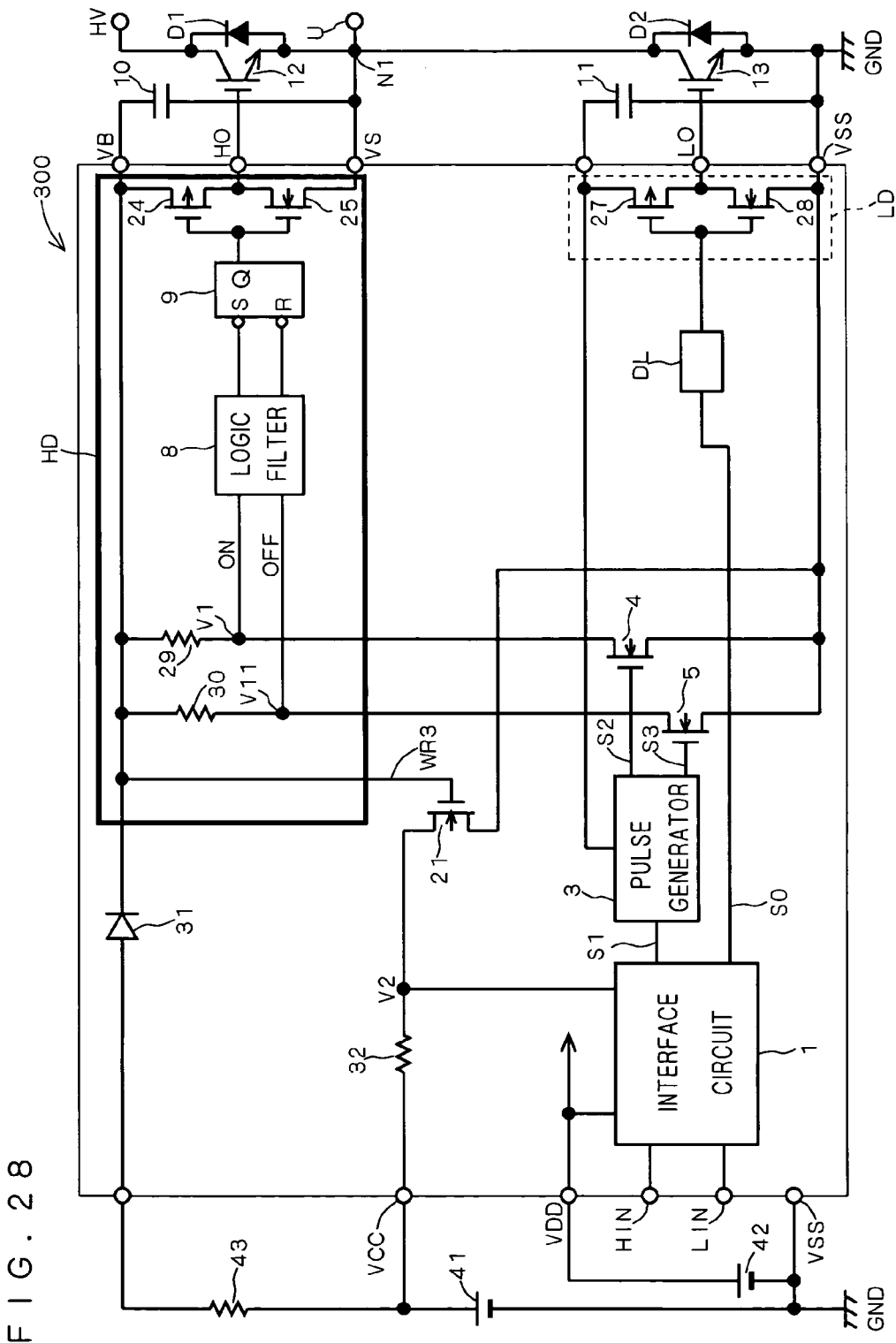
FIG. 28 is an explanatory view illustrating the circuit configuration of an HVIC according to a third preferred embodiment of the invention.

FIG. 28 illustrates the configuration of an HVIC 300 as a third preferred embodiment of the present invention. Components shown in FIG. 28 similar to those in the HVIC 100 in FIG. 1 are indicated by the same reference numerals, repeated explanation of which is thus omitted here.

Although the use of the drain interconnect line of the level shift transistor as the gate electrode of the voltage detector in the HVIC 100 has been described referring to FIG. 1 by way of example, the HVIC 300 shown in FIG. 28 uses a high side interconnect line (output line) WR3 designed specifically for the gate electrode of a voltage detector.

That is, as shown in FIG. 28, the high side interconnect line WR3 connected to one of the electrodes of the capacitor 10 for receiving the potential VB is drawn out from the high side power device driving circuit HD to the low side and is used as the gate electrode of the NMOS transistor 21 serving as a voltage detector provided on the low side.

Similarly to the HVIC 100, the logic circuit voltage VCC is applied to the drain electrode of the NMOS transistor 21 through the resistor 32, the source electrode of the NMOS transistor 21 is grounded, and the drain potential V2 of the NMOS transistor 21 is applied to the interface circuit 1.

2. Exemplary Configuration

Next, an exemplary configuration of the HVIC 300 will be described referring to FIGS. 29 and 30.

Figure 29:
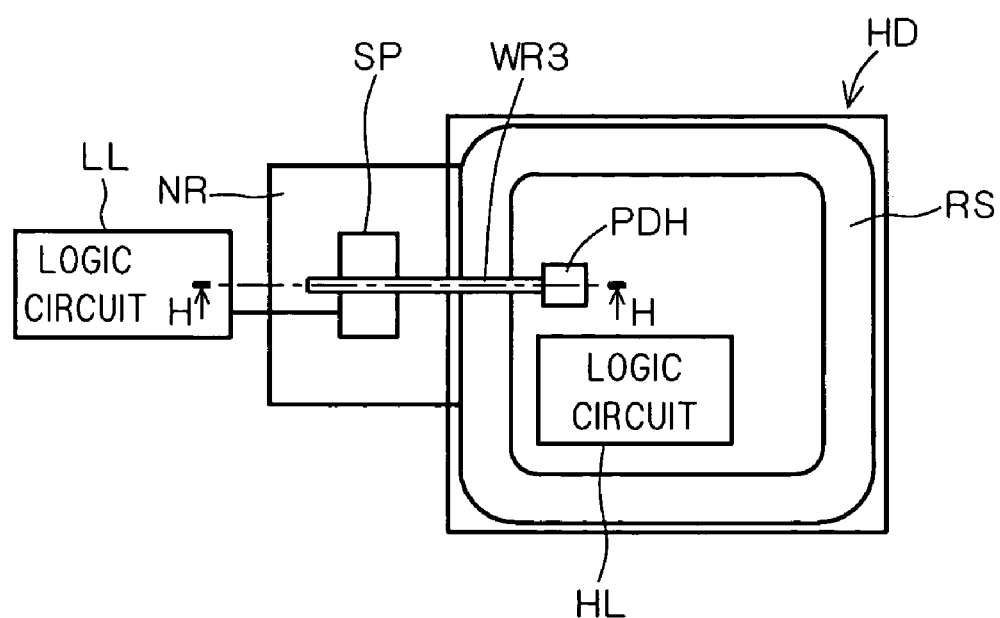
FIG. 29 is a plan view illustrating the structure of the HVIC according to the third preferred embodiment.

FIG. 29 is a plan view of the plane configuration of the HVIC 300 on a main surface of a semiconductor substrate illustrating the high side power device driving circuit HD, voltage sensor part SP in which a voltage detector such as the NMOS transistor 21 is provided, and low side logic circuit LL. FIG. 29 is a schematic view, and the size of respective components and the spacing with which they are arranged differ in a real device.

In FIG. 29, the high side interconnect line WR3 has its one end connected to a predetermined pad PDH to which the potential VB is applied, and is drawn out to extend over the isolation structure RS and voltage sensor part SP. Here, the voltage sensor part SP is provided in a non-provided region NR where semiconductor devices on the low side are not provided.

That is, if semiconductor devices on the low side are provided in contact with the high side interconnect line WR3 to which a high voltage is applied, a discharge is generated at the surface of wafer, causing malfunctions in the semiconductor devices on the low side, however, providing the voltage sensor part SP in the non-provided region NR can prevent the occurrence of such malfunctions.

Figure 30:
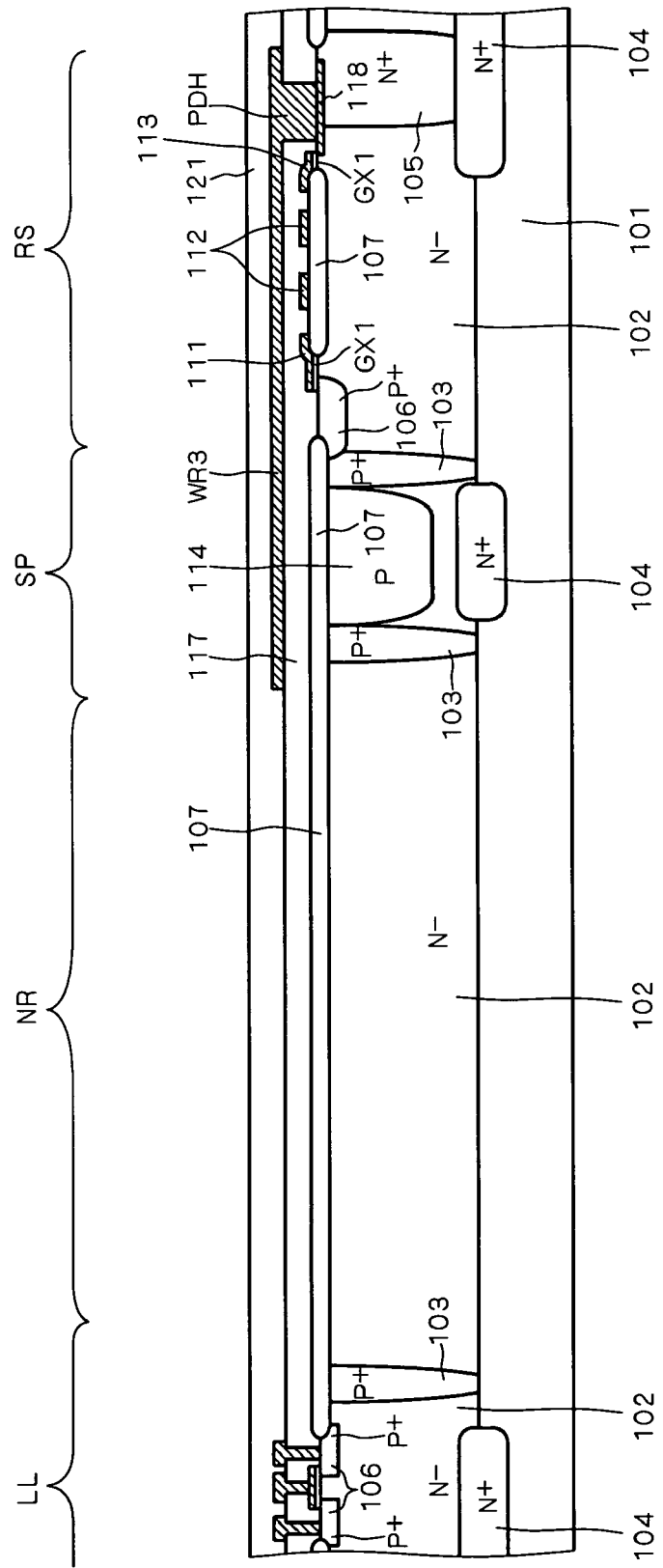
FIG. 30 is a sectional view illustrating the structure of the HVIC according to the third preferred embodiment.

FIG. 30 illustrates an example of the sectional structure taken along the line H—H of FIG. 29. Components similar to those in the HVIC 100 shown in FIG. 5 are indicated by the same reference numerals, repeated explanation of which is thus omitted here.

FIG. 30 shows the sectional structure of part of the isolation structure RS surrounding the high side power device driving circuit HD, voltage sensor part SP and low side logic circuit LL. The isolation structure RS, voltage sensor part SP and low side logic circuit LL have basically the same structures as in the HVIC 100, repeated explanation of which is thus omitted here.

As shown in FIG. 30, the high side interconnect line WR3 has its one end connected to the predetermined pad PDH to which the potential VB in the high side power device driving circuit HD is applied, and extends over the voltage sensor part SP to function as a gate electrode.

The field oxide film 107 covering part of the epitaxial layer 102 in the voltage sensor part SP also covers part of the epitaxial layer 102 that corresponds to the non-provided region NR.

3. Characteristic Effects

As described, the HVIC 300 allows the potential VS to be monitored on the low side, similarly to the HVIC 100. Therefore, the control signal HO for the power device 12 which is in a short-circuit state is stopped to turn off the power device 12, which can achieve phase fault protection.

Further, the use of the high side interconnect line WR3 designed specifically for the gate electrode of the voltage detector increases flexibility in arrangement of the voltage detector.

Fourth Preferred Embodiment

1. Device Configuration and Operation

Figure 31:
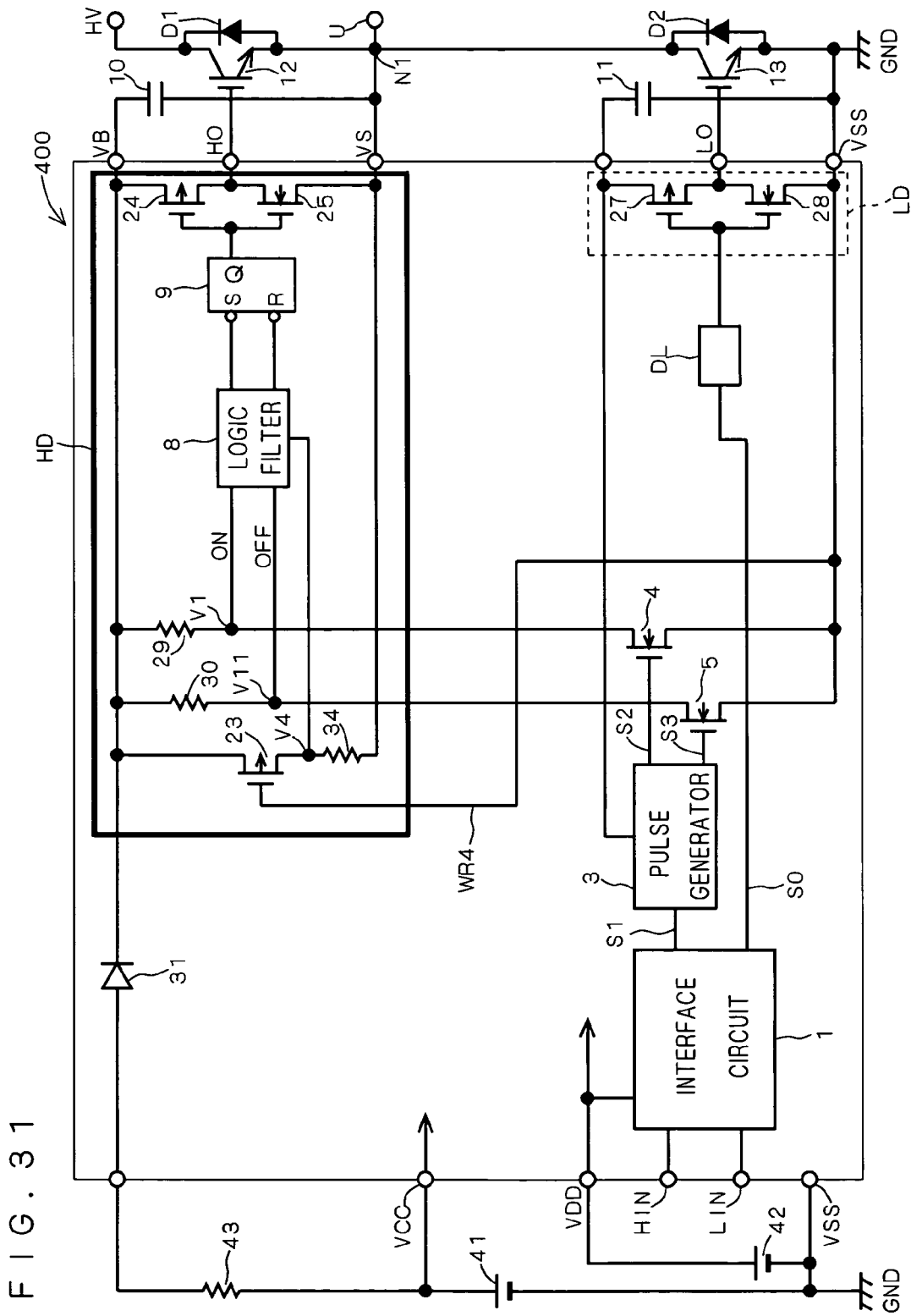
FIG. 31 is an explanatory view illustrating the circuit configuration of an HVIC according to a fourth preferred embodiment of the invention.

FIG. 31 illustrates the configuration of an HVIC 400 as a fourth preferred embodiment of the present invention. Components shown in FIG. 31 similar to those in the HVIC 200 in FIG. 25 are indicated by the same reference numerals, repeated explanation of which is thus omitted here.

The HVIC 300 described in the third preferred embodiment is configured such that the voltage detector is provided on the low side and the dedicated high side interconnect line WR3 designed is drawn out for use as the gate electrode of the voltage detector, whereas the HVIC 400 shown in FIG. 31 is configured such that a voltage detector is provided in the high side power device driving circuit HD and a dedicated low side interconnect line (output line) WR4 is drawn out from the low side for use as the gate electrode of the voltage detector.

That is, as shown in FIG. 31, the low side interconnect line WR4 connected to the ground potential is drawn into the high side power device driving circuit HD for use as the gate electrode of the PMOS transistor 23. The PMOS transistor 23 has its drain electrode connected to the node N1 through the resistor 34, and has its drain potential V4 applied to the logic filter 8. The PMOS transistor 23 has its source electrode connected to the source electrode of the PMOS transistor 24, i.e., one of the electrodes of the capacitor 10, to which the potential VB is applied.

In such configuration, the potential of the low side interconnect line WR4 is connected to the low side circuit as described above, and is therefore basically close to the ground potential GND. Thus, in the case where the potential VS at the node N1 in the high side power device driving circuit HD becomes the ground potential, for example, due to ground-fault, the PMOS transistor 23 is brought into an off state, and the drain potential V4 becomes equal to the potential VS at that time, i.e., GND, so that an output of the PMOS transistor 23 becomes "LOW".

On the other hand, in the case where the potential VS at the node N1 becomes a high potential HV, the PMOS transistor 23 is brought into an on state, and the drain potential V4 becomes the potential VS at that time, i.e., HV, so that an output of the PMOS transistor 23 becomes "HIGH". In this case, the resistance value of the resistor 34 is set so as to keep a potential difference between VS and VB.

As described, providing the PMOS transistor 23 allows the potential VS to be monitored within the high side power device driving circuit HD.

2. Exemplary Configuration

Next, an exemplary configuration of the HVIC 400 will be described referring to FIGS. 32 and 33.

Figure 32:
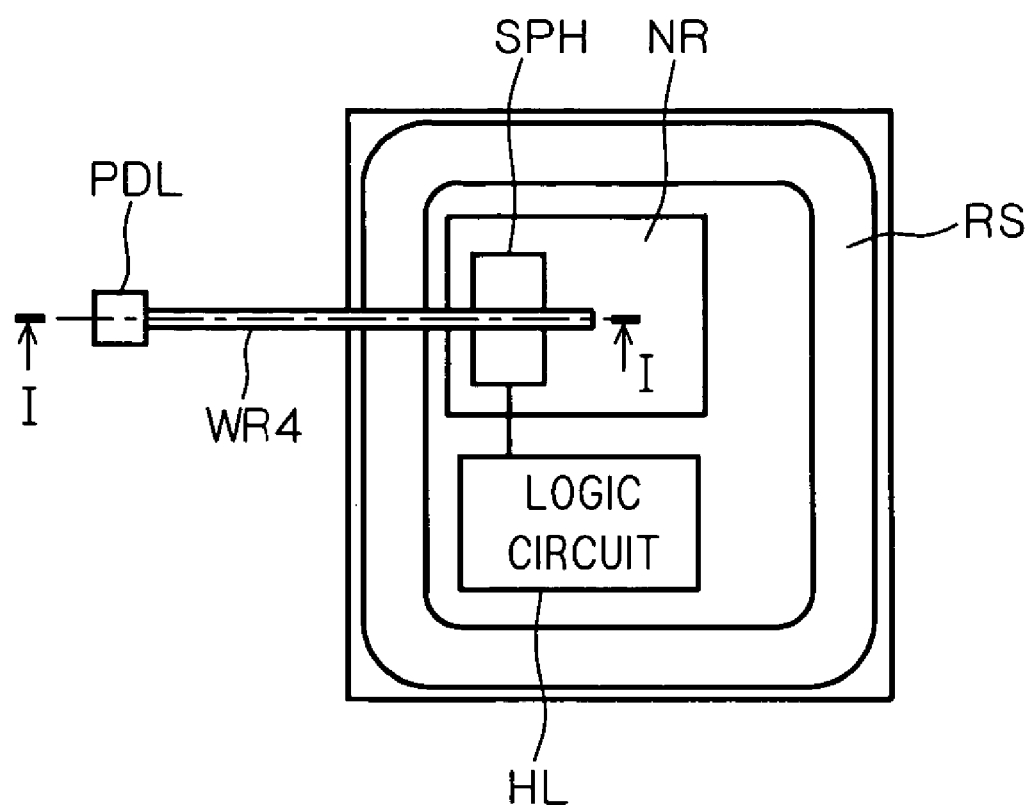
FIG. 32 is a plan view illustrating the structure of the HVIC according to the fourth preferred embodiment.

FIG. 32 is a plan view of the plane configuration of the HVIC 400 on a main surface of a semiconductor substrate illustrating the high side power device driving circuit HD, voltage sensor part SPH in which a voltage detector such as the PMOS transistor 23 is provided, and high side logic circuit HL. FIG. 32 is a schematic view, and the size of respective components and the spacing with which they are arranged differ in a real device.

In FIG. 32, the low side interconnect line WR4 has its one end connected to the predetermined pad PDL to which the ground potential GND is applied, and is drawn out to extend over the isolation structure RS and voltage sensor part SP.

Here, the voltage sensor part SPH is provided in a non-provided region NR where semiconductor devices on the low side are not provided.

That is, if semiconductor devices on the low side are provided in contact with the low side interconnect line WR4 to which a high voltage is applied, a discharge is generated at the surface of wafer, causing malfunctions in the semiconductor devices on the high side, however, providing the voltage sensor part SPH in the non-provided region NR can prevent the occurrence of such malfunctions.

Figure 33:
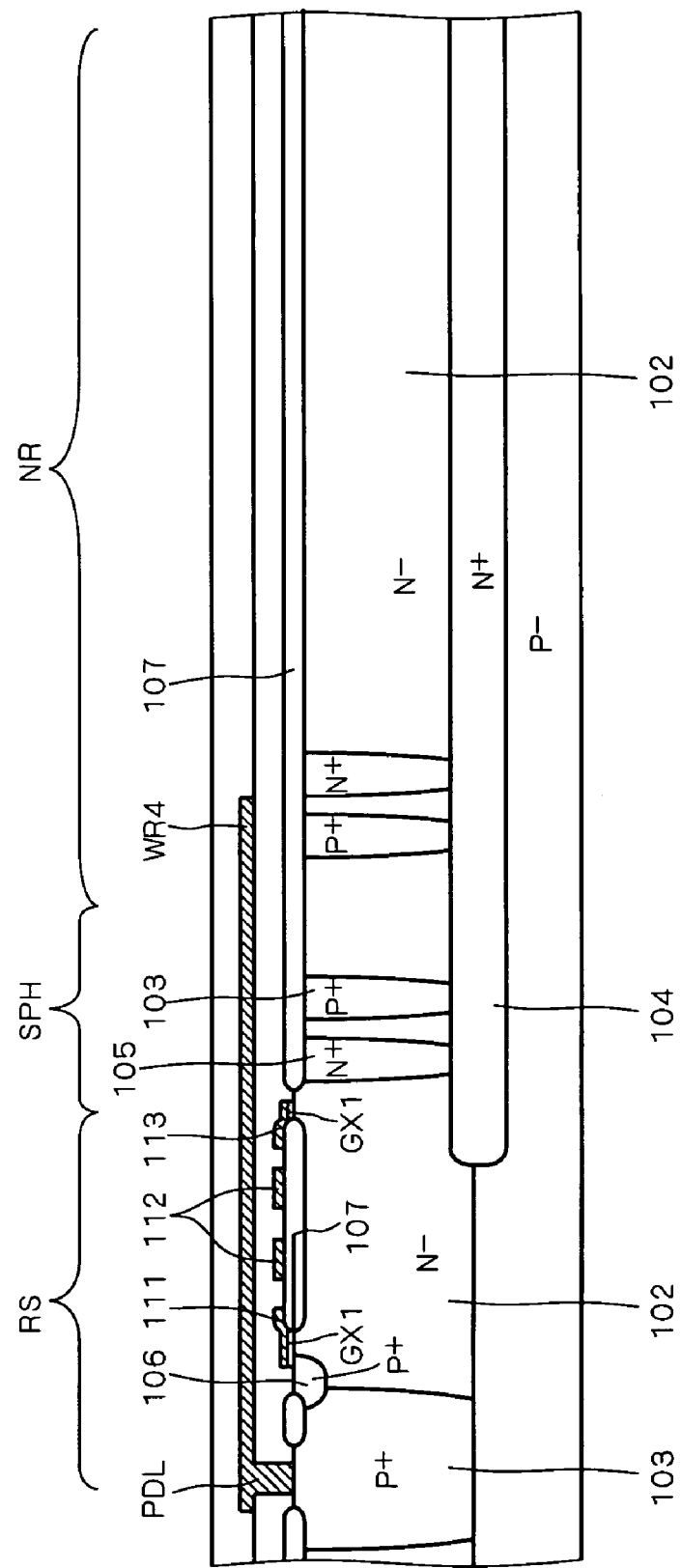
FIG. 33 is a sectional view illustrating the structure of the HVIC according to the fourth preferred embodiment.

FIG. 33 illustrates an example of the sectional structure taken along the line I—I of FIG. 32. Components similar to those in the HVIC 200 in FIG. 27 are indicated by the same reference numerals, repeated explanation of which is thus omitted here.

FIG. 33 shows the sectional structure of part of the isolation structure RS surrounding the high side power device driving circuit HD and the voltage sensor part SPH. The isolation structure RS and voltage sensor part SPH have basically the same structures as in the HVIC 200, repeated explanation of which is thus omitted here.

As shown in FIG. 33, the high side interconnect line WR4 has its one end connected to a predetermined pad PDL to which the potential GND is applied, and extends over the voltage sensor part SPH so as to function as a gate electrode.

The field oxide film 107 covering part of the epitaxial layer 102 in the voltage sensor part SPH also covers part of the epitaxial layer 102 that corresponds to the non-provided region NR.

3. Characteristic Effects

As described, the HVIC 400 allows the potential VS described in the to be monitored on the high side, similarly to the HVIC 200. Therefore, in the case where the potential VS is detected to be abnormal, such information is given to the high side logic circuit HL such as the logic filter 8, so that an OFF signal can be outputted immediately. This can reduce a time period between detection of the potential VS and stop of the high side power device.

Further, the use of the dedicated low side interconnect line WR4 as the gate electrode of the voltage detector can increase flexibility in arrangement of the voltage detector.

The voltage detector used in the second to fourth preferred embodiments may, of course, employ either of the structures described in the third to fifth modifications of the first preferred embodiments.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device performing drive control of first and second switching devices connected in series and interposed between a high main power potential and a low main power potential, comprising:

a high potential part including a control part configured to control conduction/non-conduction of a high side switching device which is one of said first and second switching devices;

a low side logic circuit provided in a low potential part operating on the basis of said low main power potential and configured to generate a control signal on the basis of a signal applied from outside, said control signal having a first state indicating conduction of said high side switching device and a second state indicating non-conduction of said high side switching device, and to generate first and second pulse signals on the basis of said control signal in correspondence with said first and second states, respectively;

first and second level shift parts configured to level-shift said first and second pulse signals to said high potential part to obtain first and second level-shifted pulse signals, respectively; and a voltage detecting device provided in said low potential part and configured to detect a potential at an output line of at least one of said first and second level shift parts and to supply a logic value based on the potential for said low side logic circuit, thereby controlling an operation of said low side logic circuit.

2. The semiconductor device according to claim 1, wherein said voltage detecting device includes:

at least one of a field oxide film and an interlayer insulating film provided in an upper portion of a semiconductor region which forms a channel region during device operation, as a gate insulating film; and at least one MOS transistor having said output line provided on said gate insulating film as a gate electrode.

3. The semiconductor device according to claim 2, wherein said at least one MOS transistor includes an odd number of MOS transistors equal to or greater than three connected in parallel, and said control signal is controlled on the basis of a logic value which is the majority of outputs of said odd number of MOS transistors.

4. The semiconductor device according to claim 2, wherein said at least one MOS transistor includes an NMOS transistor and a PMOS transistor constituting a complementary MOS transistor, said NMOS transistor and said PMOS transistor have said output line as a common gate electrode, and a logic value of an output of said complementary MOS transistor is supplied to said low side logic circuit.

5. The semiconductor device according to claim 2, wherein said at least one MOS transistor includes a plurality of MOS transistors connected in parallel, and said plurality of MOS transistors have different threshold voltages from each other.

6. The semiconductor device according to claim 2, wherein in said at least one MOS transistors, a semiconductor region including said channel region is electrically insulated from a semiconductor substrate, and a bias voltage is applied to said semiconductor region to change a potential at said semiconductor region, thereby causing a threshold voltage of said at least one MOS transistor to electrically vary.

7. A semiconductor device performing drive control of first and second switching devices connected in series and interposed between a high main power potential and a low main power potential, comprising:

a high potential part including a control part configured to control conduction/non-conduction of a high side switching device which is one of said first and second switching devices;

a reverse level shift part configured to level-shift a signal from said high potential part to supply the level-shifted signal to a low side logic circuit operating on the basis of said low main power potential; and a voltage detecting device provided in said high potential part and configured to detect a potential at an output line of said reverse level shift part and to supply a logic value based on said potential for said control part, thereby causing said control part to control conduction/non-conduction of said high side switching device.

8. The semiconductor device according to claim 7, wherein said voltage detecting device includes:

at least one of a field oxide film and an interlayer insulating film provided in an upper portion of a semiconductor region which forms a channel region during device operation as a gate insulating film; and at least one MOS transistor having said output line provided on said gate insulating film as a gate electrode.

9. The semiconductor device according to claim 8, wherein said at least one MOS transistor includes an odd number of MOS transistors more than two connected in parallel, and said control signal is controlled on the basis of a logic value which is the majority of outputs of said odd number of MOS transistors.

10. The semiconductor device according to claim 8, wherein said at least one MOS transistor includes an NMOS transistor and a PMOS transistor constituting a complementary MOS transistor, said NMOS transistor and said PMOS transistor have said output line as a common gate electrode, and a logic value of an output of said complementary MOS transistor is supplied to said low side logic circuit.

11. The semiconductor device according to claim 8, wherein said at least one MOS transistor includes a plurality of MOS transistors connected in parallel, and said plurality of MOS transistors have different threshold voltages from each other.

12. The semiconductor device according to claim 8, wherein in said at least one MOS transistor, a semiconductor region including said channel region is electrically insulated from a semiconductor substrate, and a bias voltage is applied to said semiconductor region to change a potential at said semiconductor region, thereby causing a threshold voltage of said at least one MOS transistor to electrically vary.

13. A semiconductor device performing drive control of first and second switching devices connected in series and interposed between a high main power potential and a low main power potential, comprising:

a high potential part including a control part configured to control conduction/non-conduction of a high side switching device which is one of said first and second switching devices;

a low side logic circuit provided in a low potential part operating on the basis of said low main power potential and configured to generate a control signal on the basis of a signal applied from outside, said control signal having a first state indicating conduction of said high side switching device and a second state indicating non-conduction of said high side switching device, and to generate first and second pulse signals on the basis of said control signal in correspondence with said first and second states, respectively; and a voltage detecting device provided in said low potential part and configured to detect a potential at an output line extending out of said high potential part outputting said high main power potential and to supply a logic value based on said potential for said low side logic circuit, thereby controlling an operation of said low side logic circuit.

14. The semiconductor device according to claim 13, wherein
said voltage detecting device is provided in a non-provided region of said low potential part where a semiconductor device operating on the basis of said low main power potential is not provided.

15. The semiconductor device according to claim 13, wherein
said voltage detecting device includes:
at least one of a field oxide film and an interlayer insulating film provided in an upper portion of a semiconductor region which forms a channel region during device operation as a gate insulating film; and
at least one MOS transistor having said output line provided on said gate insulating film as a gate electrode.

16. The semiconductor device according to claim 15, wherein
said at least one MOS transistor includes an odd number of MOS transistors more than two connected in parallel, and
said control signal is controlled on the basis of a logic value which is the majority of outputs of said odd number of MOS transistors.

17. The semiconductor device according to claim 15, wherein
said at least one MOS transistor includes an NMOS transistor and a PMOS transistor constituting a complementary MOS transistor,
said NMOS transistor and said PMOS transistor have said output line as a common gate electrode, and
a logic value of an output of said complementary MOS transistor is supplied to said low side logic circuit.

18. The semiconductor device according to claim 15, wherein
said at least one MOS transistor includes a plurality of MOS transistors connected in parallel, and
said plurality of MOS transistors have different threshold voltages from each other.

19. The semiconductor device according to claim 15, wherein
in said at least one MOS transistor, a semiconductor region including said channel region is electrically insulated from a semiconductor substrate, and
a bias voltage is applied to said semiconductor region to change a potential at said semiconductor region, thereby causing a threshold voltage of said at least one MOS transistor to electrically vary.

20. A semiconductor device performing drive control of first and second switching devices connected in series and interposed between a high main power potential and a low main power potential, comprising:
a high potential part including a control part configured to control conduction/non-conduction of a high side switching device which is one of said first and second switching devices; and
a voltage detecting device provided in said high potential part and inserted between said high main power potential and a node between said first and second switching devices, said voltage detecting device being configured to detect a potential at said node between said first and second switching devices and to supply a logic value based on said potential for said control part, thereby causing said control part to control conduction/non-conduction of said high side switching device, wherein
said voltage detecting device includes at least one MOS transistor whose conduction/non-conduction is controlled on the basis of a potential at an output line extending out of said low potential part outputting said low main power potential.

21. The semiconductor device according to claim 20, wherein
said voltage detecting device is provided in a non-provided region of said high potential part where a semiconductor device operating on the basis of said high side main power potential is not provided.

22. The semiconductor device according to claim 20, wherein
said voltage detecting device includes:
at least one of a field oxide film and an interlayer insulating film provided in an upper portion of a semiconductor region which forms a channel region during device operation as a gate insulating film; and
at least one MOS transistor having said output line provided on said gate insulating film as a gate electrode.

23. The semiconductor device according to claim 22, wherein
said at least one MOS transistor includes an odd number of MOS transistors more than two connected in parallel, and
said control signal is controlled on the basis of a logic value which is the majority of outputs of said odd number of MOS transistors.

24. The semiconductor device according to claim 22, wherein
said at least one MOS transistor includes an NMOS transistor and a PMOS transistor constituting a complementary MOS transistor,
said NMOS transistor and said PMOS transistor have said output line as a common gate electrode, and
a logic value of an output of said complementary MOS transistor is supplied to said low side logic circuit.

25. The semiconductor device according to claim 22, wherein
said at least one MOS transistor includes a plurality of MOS transistors connected in parallel, and
said plurality of MOS transistors have different threshold voltages from each other.

26. The semiconductor device according to claim 22, wherein
in said at least one MOS transistor, a semiconductor region including said channel region is electrically insulated from a semiconductor substrate, and
a bias voltage is applied to said semiconductor region to change a potential in said semiconductor region, thereby causing a threshold voltage of said at least one MOS transistor to electrically vary.

* * * * *